US011888441B2

(12) United States Patent
Moslehi

(10) Patent No.: US 11,888,441 B2
(45) Date of Patent: Jan. 30, 2024

(54) SOLAR PHOTOVOLTAIC MODULE REMOTE ACCESS MODULE SWITCH AND REAL-TIME TEMPERATURE MONITORING

(71) Applicant: Sigmagen, Inc., Los Altos, CA (US)

(72) Inventor: Mehrdad M. Moslehi, Los Altos, CA (US)

(73) Assignee: Sigmagen, Inc., Los Altos, CA (US)

( * ) Notice: Subject to any disclaimer, the term of this patent is extended or adjusted under 35 U.S.C. 154(b) by 798 days.

(21) Appl. No.: 16/984,539

(22) Filed: Aug. 4, 2020

(65) Prior Publication Data
US 2021/0058028 A1 Feb. 25, 2021

Related U.S. Application Data

(63) Continuation of application No. 15/405,273, filed on Jan. 12, 2017, now Pat. No. 10,784,815, which is a continuation-in-part of application No. 14/428,598, filed as application No. PCT/US2014/034054 on Apr. 14, 2014, now abandoned.
(Continued)

(51) Int. Cl.
*H02S 40/34* (2014.01)
*H02S 50/00* (2014.01)
*H04Q 9/00* (2006.01)
*H01L 31/02* (2006.01)

(52) U.S. Cl.
CPC ........ *H02S 40/34* (2014.12); *H01L 31/02021* (2013.01); *H02S 50/00* (2013.01); *H04Q 9/00* (2013.01); *G05B 2219/37431* (2013.01); *H04Q 2209/30* (2013.01); *H04Q 2209/40* (2013.01); *Y02E 10/50* (2013.01)

(58) Field of Classification Search
CPC ......... Y02E 10/50; Y02E 10/56; H02S 50/10; H02S 40/34; H02S 50/00; H02J 13/00002; H02J 2300/26; H02J 2300/24; H02J 3/385; H02J 3/383
See application file for complete search history.

(56) References Cited

U.S. PATENT DOCUMENTS 5,867,011 A 2/1999 Jo et al.
6,278,054 B1 8/2001 Ho et al.
(Continued)

FOREIGN PATENT DOCUMENTS

JP 2010-252559 A 11/2010
WO 2009/055456 A1 4/2009
(Continued)

OTHER PUBLICATIONS

Patent Cooperation Treaty, PCT International Search Report and Written Opinion issued in PCT/US2014/034054, dated Nov. 20, 2014, pp. 1-8.

*Primary Examiner* — Ryan Johnson
(74) *Attorney, Agent, or Firm* — Pillsbury Winthrop Shaw Pittman LLP

(57) ABSTRACT

A method for calculating a real-time effective temperature of a solar photovoltaic module at any operating time during power generation period between a daily wake-up time and sleep time of said solar photovoltaic module is provided. The method is based on, in part, measuring the solar photovoltaic module open-circuit voltage at said daily wake-up time and measuring the solar photovoltaic module open-circuit voltage at said operating time.

4 Claims, 18 Drawing Sheets

Related U.S. Application Data

(60) Provisional application No. 62/277,845, filed on Jan. 12, 2016, provisional application No. 61/895,326, filed on Oct. 24, 2013, provisional application No. 61/811,736, filed on Apr. 13, 2013.

(56) References Cited

U.S. PATENT DOCUMENTS

| | | | |
|---|---|---|---|
| 6,350,944 | B1 | 2/2002 | Sherif et al. |
| 6,650,031 | B1 | 11/2003 | Goldack |
| 7,759,158 | B2 | 7/2010 | Bachrach et al. |
| 7,839,022 | B2 | 11/2010 | Wolfs |
| 8,093,757 | B2 | 1/2012 | Wolfs |
| 8,427,009 | B2 | 4/2013 | Shaver, II et al. |
| 8,624,436 | B2 | 1/2014 | Willis |
| 8,922,061 | B2 | 12/2014 | Arditi |
| 2003/0000568 | A1 | 1/2003 | Gonsiorawski |
| 2003/0121514 | A1 | 7/2003 | Davenport et al. |
| 2003/0213974 | A1 | 11/2003 | Armstrong et al. |
| 2004/0021445 | A1 | 2/2004 | Harris |
| 2005/0172995 | A1 | 8/2005 | Rohrig et al. |
| 2006/0290317 | A1 | 12/2006 | McNulty et al. |
| 2007/0215196 | A1 | 9/2007 | Nakashima et al. |
| 2008/0041434 | A1 | 2/2008 | Adriani et al. |
| 2008/0121272 | A1 | 5/2008 | Besser et al. |
| 2008/0147335 | A1* | 6/2008 | Adest .................. G01D 4/004 |
| | | | 702/188 |
| 2008/0283115 | A1 | 11/2008 | Fukawa et al. |
| 2009/0078300 | A1 | 3/2009 | Ang et al. |
| 2010/0116325 | A1 | 5/2010 | Nikoonahad |
| 2010/0139734 | A1 | 6/2010 | Hadar et al. |
| 2010/0224239 | A1 | 9/2010 | Sharps et al. |
| 2010/0308662 | A1 | 12/2010 | Schatz et al. |
| 2011/0068637 | A1 | 3/2011 | Kiamilev et al. |
| 2011/0218687 | A1 | 9/2011 | Hadar et al. |
| 2011/0290306 | A1 | 12/2011 | Roberts |
| 2011/0301772 | A1* | 12/2011 | Zuercher .......... H01L 31/02021 |
| | | | 700/292 |
| 2012/0085384 | A1 | 4/2012 | Beitel et al. |
| 2012/0325283 | A1 | 12/2012 | Robbins |
| 2013/0194706 | A1* | 8/2013 | Har-Shai .............. H02H 1/0015 |
| | | | 361/42 |
| 2013/0221753 | A1 | 8/2013 | Perreault et al. |
| 2014/0001865 | A1 | 1/2014 | Osterloh et al. |

FOREIGN PATENT DOCUMENTS

| | | |
|---|---|---|
| WO | 2011/106902 A2 | 9/2011 |
| WO | 2011/163437 A2 | 12/2011 |
| WO | 2014/169292 A2 | 10/2014 |

* cited by examiner

SOLAR PHOTOVOLTAIC MODULE REMOTE ACCESS MODULE SWITCH AND REAL-TIME TEMPERATURE MONITORING

CROSS-REFERENCE TO RELATED APPLICATIONS

This application is a continuation of U.S. patent application Ser. No. 15/405,273 filed Jan. 12, 2017, which claims priority to U.S. provisional patent application 62/277,845 filed Jan. 12, 2016. U.S. patent application Ser. No. 15/405, 273 is also a continuation-in-part of U.S. patent application Ser. No. 14/428,598 filed Mar. 16, 2015, which a National Stage application of International Application No. PCT/US14/34054 filed Apr. 14, 2014, which claims the benefit of U.S. provisional applications 61/811,736 filed on Apr. 13, 2013 and 61/895,326 filed on Oct. 24, 2013, all of which are hereby incorporated by reference in their entirety.

FIELD OF THE INVENTION

The present disclosure relates in general to the fields of solar photovoltaic (PV) cells and modules, and more particularly remote access power control and real-time temperature monitoring systems for solar photovoltaic modules.

BACKGROUND

Advances in solar photovoltaics (PV) and solar cell technology have paved the path for cost-reduced mass production and large scale adoption of solar cells and modules as renewable clean energy production mechanisms. As this technology is implemented, there is an increased need for safety and power efficiency improvement at the cell, module, and system levels. A typical solar system comprises solar cells mounted and connected in a solar module laminate and a various assortment of string and solar system level components for transferring and collecting the electrical power generated by the solar cells at the load (e.g., a power converter unit such as a DC-to-AC power inverter unit). The solar module electrically connects a number of solar cells (typically in one or more series-connected strings of solar cells) for power harvesting and typically encapsulates or packages the electrically interconnected (e.g., via tabbing/stringing) solar cells in a solar module laminate comprising a transparent protective front cover such as glass and a protective back sheet and suitable encapsulant layers such as ethylene vinyl acetate (EVA).

Generally, solar system electrical power is collected from a module laminate (or a number of electrically connected solar modules such as modules connected in electrical series or parallel or combination of series and parallel) positive and negative leads/terminals relying on external electrical wiring to connect modules and collect power. Thus, when the solar cells are receiving sunlight and generating electrical power, the solar module output leads are electrically hot (i.e., they have an electrical voltage and can deliver electrical power to a load). Further, it is often difficult to control the electrical power output of the module and existing control systems rely on external electrical breaker switches or other module external means to connect or disconnect module outputs. These solutions are often discrete external module level components which leave hot module wires, are prone to failure, and require complex fabrication. Some other prior art configurations use external micro-inverters or DC-DC power optimizers externally attached to the external module output leads. The external micro-inverter or DC-DC power optimizers can disconnect the module power delivery to the load but they add significant cost and complexity to the PV modules and do not disconnect the module power delivery internally within the module laminate.

Additionally, as solar PV modules are increasingly transported and installed on commercial and residential rooftops and facades as well as utility-scale solar power plants and other specialty applications (e.g., portable and transportable power generation applications such as automotive applications), the need for transporting, installing, and controlling solar modules safely and efficiently increases. And as solar PV system use increases, awareness and prevention of module theft and safety requirements during operation and maintenance become increasing concerns.

Additionally, field-installed PV modules may experience temperature variations due to environmental climate conditions as well as partial thermalization of incident sunlight within the module. Thermalization effects may occur within the semiconductor absorber, due to thermalization of the excess photon energies above bandgap energy, as well as absorption of sunlight in module. Additional thermalization effects may occur in a solar cell due to shade-induced hot spots caused by reverse biasing of the cell unless reverse biasing is prevented by using bypass diodes.

Temperature of solar cells within a PV module has a strong impact on the energy yield (kWh/kWp) of the solar module. For example, for a given incident sunlight power density the solar cell voltage and power values are reduced with increasing cell temperature.

However, the PV module temperature may not be a constant or uniform over the entire module area and may vary from solar cell to solar cell within each module laminate (variations due to effects such as non-uniform solar irradiance, partial shading effects, etc.). An important temperature to measure in a PV module is the temperature of the embedded solar cells within the module laminate as the cells themselves are the primary thermalization sources and also the electricity power generators within the module. Each solar cell temperature may be measured by infrared (IR) thermal imaging or embedded bonded thermocouples. Yet, often real-time measurement/monitoring of the temperature values for PV modules in actual field-installed PV systems using either thermal imaging or embedded thermocouples in every module is not a viable and cost-effective approach. Thermocouples embedded in the module laminate complicate the module manufacturing and add to the cost of the junction box. Moreover, electronic circuitry may be required to digitize and transmit the measured temperature data.

BRIEF SUMMARY OF THE INVENTION

Therefore, a need has arisen for solar photovoltaic module remote-access module switch and real-time temperature monitoring systems that provide improved and low cost solar cell real-time solar cell temperature measurement and module safety and anti-theft improvements with minimal module power generation impact (i.e., minimal insertion losses). In accordance with the disclosed subject matter, a solar photovoltaic module remote-access module switch and real-time temperature monitoring systems is provided which substantially eliminates or reduces disadvantages associated with previously developed solar photovoltaic module remote-access module switch and real-time temperature monitoring systems.

According to one aspect of the disclosed subject matter, a solar photovoltaic module remote-access module switch and real-time temperature monitoring system is provided.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein.

DETAILED DESCRIPTION

Figure 1:
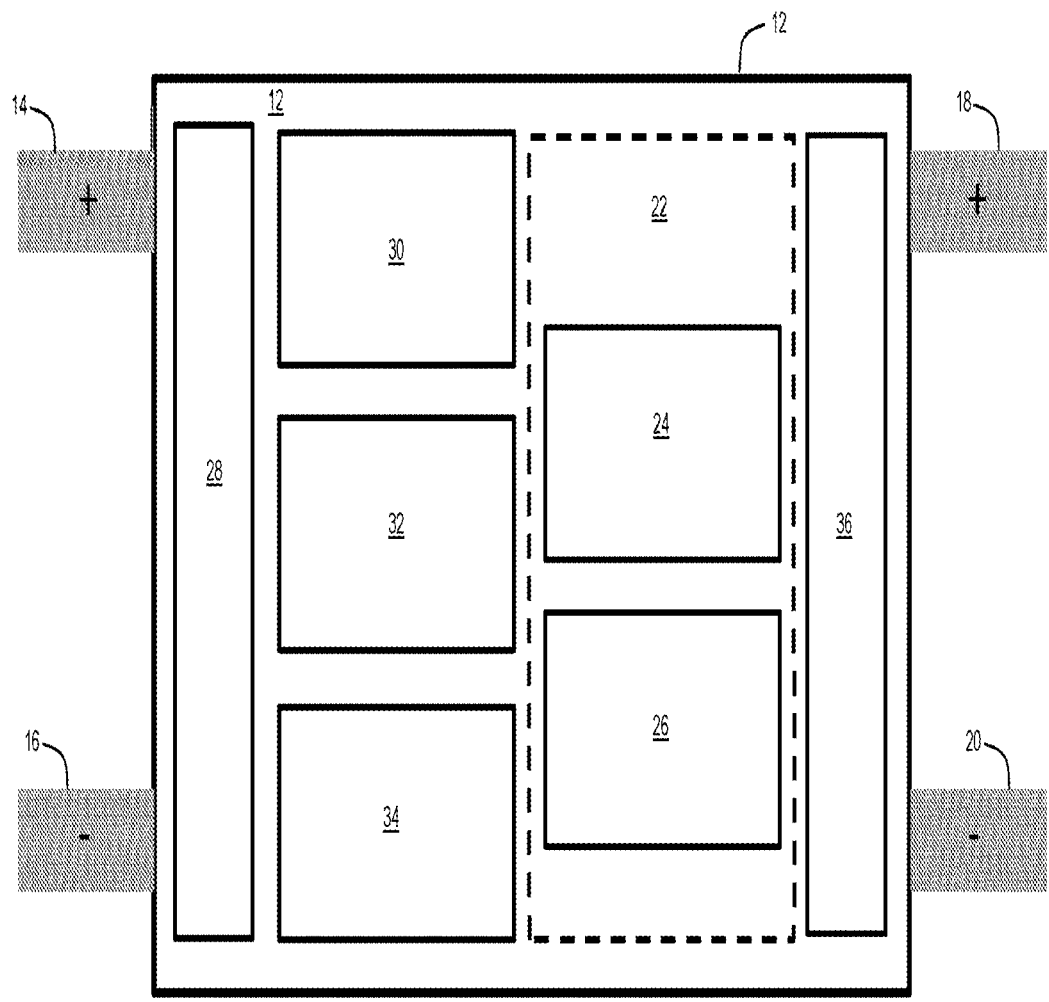
FIG. 1 is a diagram of a remote access module switch (RAMS) power electronic circuit (which may be implemented either as a single-package monolithic integrated circuit or as a multi-component printed-circuit board) to be embedded within the module laminate.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments and components, such as a remote access module switch (RAMS) power electronic circuit controlled by a command signal, one skilled in the art could apply the principles discussed herein to other components and circuitry (such as a control switch with embedded memory or wireless control), technical areas, and/or embodiments without undue experimentation.

The present application provides a solution for effectively and efficiently controlling solar module power output while increasing module handling safety and resolving the fabrication and reliability challenges associated with known solar module control systems while also providing enhanced theft protection and optional module status monitoring functionality. In addition to remote-controlled module power ON/OFF switching, the robust solar module systems of the present application may also provide module identification within a module array or a solar system comprising a plurality of PV module laminates (each with an embedded RAMS power electronic circuit which optionally has a unique module identifier), theft deterrence through anti-theft functionality, real-time module status monitoring and updates (such as the module laminate or RAMS circuit temperature and module power delivery), and surge and electrostatic discharge (ESD) protection for the module power control component (RAMS circuit) and solar cells within the PV module laminate. Further, the electrical components of the disclosed system may be implemented as low cost and minimal impact components, and in may be powered by the module itself (i.e., self-powering RAMS power electronic circuit without a need for external power supply).

Solar cell modules (or solar PV module laminates) generally comprise a plurality of solar cells positioned between a front and back side encapsulant/laminate layer (e.g., EVA or polyolefin or another suitable encapsulant). Other layers, among others, may include a frontside protective cover such as a rigid optically transparent glass layer (for rigid glass-covered modules) or a flexible lightweight optically transparent cover layer (e.g., a fluoro-polymer cover sheet such as ETFE or FPE between the transparent front cover and solar cells) and a backside protective layer (between the solar cells and the backside protective layer. The PV module laminate may be a flexible (and/or lightweight) or rigid (typically glass-covered) laminate structure, may also be framed or frameless, and also modified for a variety of applications such as building integrated photovoltaics (BIPV).

The solar module power control systems of the present application utilize at least one remote access module control switch (RAMS) circuit embedded within the module laminate which acts as a power gate or power switch to the module (in other words a remote-controlled module-level bypass switch and control according to the embodiments of this invention), capable of gating and controlling module power output (i.e., enable or disable the module power delivery to outside the module laminate). In the primary embodiments of this invention, the remote-controlled RAMS switch is a bypass switch which shunts the module power leads internally (hence, internally looping the module current) when the module power delivery is turned OFF. The remote-controlled RAMS bypass switch is in the open position (not shunting the module leads) when the module power delivery is turned ON. For example, the RAMS may be either a single-package monolithic CMOS chip having a bypass switch design or a multi-component printed circuit board (PCB) having a bypass switch design embedded within the module laminate. A single RAMS circuit may be embedded per photovoltaic (PV) module and positioned within the module encapsulant and through which the module's power output flows. Or alternatively, multiple RAMS power electronic circuits (e.g., three RAMS circuits associated with three electrically interconnected sub-strings of solar cells within the module laminate) may be embedded within the module laminate, each connected to an array (plurality) of series connected or hybrid parallel-series connected solar cells. The RAMS electronic circuit itself (e.g., either a single-package monolithic integrated circuit or a multi-component PCB) may be positioned and attached (e.g., by soldering and/or conductive adhesive) to a string of electrically interconnected solar cells using a variety of mechanisms (e.g., attached to a supporting backplane if/when the solar cells are mounted on a backplane with an interconnection structure) or positioned as a discrete component (either a monolithic integrated circuit or a multi-component PCB) proximate and/or between the solar cell string output electrical leads and connected to them through electrical bussing connectors within the module laminate. Importantly, module power must pass through the embedded RAMS circuit before it may be delivered externally via module external outputs (power delivery to outside the module laminate is enabled when the remote-controlled RAMS enables power delivery by making its bypass switch open and not shunting the module current internally).

Because the power delivery switch (RAMS power electronic circuit) is embedded in the module laminate and is internal to the module, when the switch turns the module OFF to disable power delivery to the outside (i.e., if a parallel bypass switch gate when the switch is closed/shorted to bypass the module current internally, hence disabling power delivery beyond the RAMS gate) power is contained (i.e., the module current loops internally) within the module—thus the switch acts as anti-theft device and the module, including any external module output leads, is safe for handling as there is no external power delivery. In some instances, it may be desired to reduce the current associated with a solar cell or string of solar cells connected in series to the RAMS switch to mitigate losses resulting from the internal module current looping and to enable small-footprint, low-cost implementation of the embedded RAMS power electronics. In such embodiments, each solar cell is made of monolithically-tiled or monolithically-isled sub-cells which are interconnected in electrical series or in a hybrid combination of parallel and series, in order to provide solar cells with scaled-up voltage and scaled-down current. This results in scaling down the module current and scaling up its voltage, hence, enabling the RAMS power electronics circuit to be designed for a scaled-down current and scaled-up voltage arrangement. Representative scaling factors for monolithically-isled solar cells used in conjunction with the RAMS embodiments of this invention may be in the range of about 4 to 16. For instance, a monolithically-isled crystalline silicon solar cell capable of generating about 5.3 W of peak power with a sub-cell interconnection scheme to provide a scaling factor of 8 can produce a maximum-power cell voltage on the order of 4.6 V and a maximum-power cell current on the order of 1.16 A For a series-connected string of such solar cells, the string current is also reduced by a scaling factor of 8 (for instance, corresponding to about 1.16 A), while the string voltage for the series-connected string is increased by a factor of 8. This configuration can enable a lower-loss and lower-cost implementation of the RAMS embodiments of this invention with smaller power electronic circuit (monolithic package or PCB) footprints.

The RAMS power electronic switch may be a parallel or bypass switch such that when the switch is open (e.g., the RAMS is ON or enables power delivery), module power is provided to the external module leads and can be delivered to the external load (e.g., a power inverter unit such as a string inverter or a central inverter attached to a plurality of RAMS-embedded modules), or may be a control switch positioned in series with the module power output such that power is delivered when the series switch is closed. When a RAMS-embedded PV module is in power delivery mode (i.e., RAMS enabling power delivery), an advantage of a parallel or bypass switch gate (as compared to a series switch) is the substantial reduction of the insertion loss of the RAMS power electronic circuit. This is due to fact that the RAMS with a parallel or bypass switch gate design does not have the series resistance of a closed switch in the current path (contrary to the series switch gate). Thus, a parallel or bypass switch RAMS reduces the insertion loss associated with its use. Other insertion loss factors of the RAMS chip (associated with both the parallel/bypass switch and series switch designs) include additional and/or optional circuit functional blocks (such as the functional blocks shown in FIG. 1) and the power consumption of the RAMS power electronic circuit since it is powered by the module itself. Through RAMS power electronic design and by minimizing RAMS insertion loss and power consumption, the insertion loss of the RAMS power electronic circuit embedded within the module laminate (implemented either as a single-package monolithic integrated circuit or as a multi-component PCB) in module power delivery mode (i.e., when the RAMS switch gate enables module power delivery) may be reduced to less than 1% of the module power (and in some instances to substantially <<1%). The low-insertion loss is further facilitated if and when the embedded RAMS embodiments of this invention are used in conjunction with monolithically-isled (or monolithically-tiled) solar cells with scaled down currents and scaled up voltages. Methods and structures for monolithically-isled (or monolithically-tiled) solar cells with scaled down currents and scaled up voltages referred to herein as icells may be found in commonly owned U.S. patent application Ser. No. 14/072,759 filed Nov. 5, 2013 which is hereby incorporated by reference in its entirety.

To further reduce RAMS cost, RAMS power electronics circuit may be implemented in a single-package monolithic integrated circuit, such as a single-package surface mount technology (SMT) monolithic complementary metal-oxide-semiconductor (CMOS) chip package, or alternatively, RAMS power electronics circuit may comprise a core monolithic chip and a few discrete component(s) such as capacitors and/or an inductor and all housed in a package (e.g., such as a system in a package SIP or hybrid SIP, or assembled in a small-footprint printed-circuit board or PCB). For example, a complementary metal-oxide-semiconductor (CMOS), e.g. silicon CMOS, power electronics integrated circuit having a parallel or bypass switch (as compared to a series switch) can provide a small-footprint, small-thickness (i.e., low profile), and low cost RAMS monolithic integrated circuit (or alternatively RAMS PCB), and helps further reduce RAMS chip insertion loss/power dissipation. This is further enabled when using RAMS in a module laminate comprising a plurality of monolithically-isled (or monolithically-tiled) solar cells, each with a scaled-down current and a scaled-up voltage in order to substantially reduce the electrical current of the module laminate being handled by the RAMS power electronics circuit.

The RAMS chip is preferably powered by the PV module and does not require a separate power supply. The power consumption of the RAMS power electronics circuit embodiments of this invention (with the preferred parallel or bypass switch mode) is essentially its insertion loss. Thus, the RAMS power electronics circuit powers/wakes up with the module during daylight hours when solar power is generated and powers down/sleeps with the module at night when the cells are not generating electrically power.

FIG. 1 is a schematic functional block diagram of a remote access module switch (RAMS) power electronics circuit (implemented as a monolithic integrated circuit or as an SIP or as a multi-component PCB) highlighting exemplary functionality building blocks and having two input electrical terminals and two output electrical terminals (implemented either as leads or leadless pads). For example, RAMS power electronics package 12 may be a relatively small footprint monolithic CMOS integrated circuit or a multi-component SIP package such as a low-profile package or a multi-component PCB, and with the RAMS footprint in the range of about 1 to a few square millimeters in size for monolithic integrated circuit implementation, or from a few square millimeters up to about 10's of square millimeters for an SIP package or a PCB implementation, for low impact integration as an embedded power electronics circuit in the module laminate. Positive input terminal (e.g., lead or pad) 14 and negative input terminal (e.g., lead or pad) 16 provide internal connection to module electrical bussing terminals and positive output terminal (e.g., lead or pad) 18 and negative output terminal (e.g., lead or pad) 20 are electrical bussing connectors to the external module terminals (e.g., leads). Importantly, to further reduce the footprint and implementation cost, the RAMS power electronics functional design shown does not require embedded memory. For instance, a CMOS analog/digital integrated circuit can be implemented with lower footprint and cost without a requirement for embedded memory such as non-volatile memory.

Functional block 22 is a remotely controlled module ON/Off switch gate comprising alternative-current or AC (e.g., in the approximate frequency range of 50 KHz to 1 MHz) pulse train detector, peak detector, and sample and hold circuit 24 and switch driver and module ON/OFF bypass switch 26. Optional functionalities and electronics include sub-string shade management component 28 (for example at least one bypass switch such as a Schottky Barrier Diode—SBR), module voltage, current, and/or power measurement component 30 (measuring the actual module power being delivered in real time), module temperature measurement (as measured on the RAMS power electronics circuit) component 32, AC power line modulation with unique module identifier or ID (e.g., unique AC power line communication carrier frequency) component 34 (providing unique module identification and temperature and power delivery information of module—therefore, the real-time power and temperature measurements are tagged with a unique identifier which indicates which module is associated with the real-time measurements for status monitoring), and transient voltage suppressor (TVS), electrostatic discharge (ESD), and lightning surge protection component 36 (which protects the RAMS power electronics circuit and the other module components such as the embedded solar cells and other embedded electronics components, by shunting transient surges arriving at the module through its output electrical terminals). Additional optional functional blocks not shown may include output voltage regulator regulating module output voltage based on a pre-set or a dynamically defined voltage. Functional blocks, such as components 30 and 32 shown in FIG. 1, may provide real time module status measurements by the RAMS power electronics circuit, relating to, for example, module power generation/delivery and average of the temperature of the RAMS power electronics circuit to a central data acquisition system, for example a PV array control and status monitoring system (PACS) as described below, via power line communication (PLC) or a wireless network at an acceptable interval (e.g., real-time power delivery and temperature measurements being performed at intervals of about once every fraction of a second to once every 10's of seconds). Because the RAMS power electronics circuit (monolithic integrated circuit or SIP or PCB) is embedded in the module laminate similar to the solar cells themselves, the RAMS temperature measurement reflects a fairly good representation of the temperature of the solar cells in the module during the field operation. And because the RAMS power electronics circuit is a pass through gate for the power delivery of the module, fairly accurate module voltage and current measurements may be performed in real time.

As discussed before, the RAMS power electronics circuit may be implemented as a monolithic integrated circuit (in other words, as a single package IC), or may comprise several discrete components (for example a core monolithic chip and at least one discrete component such as a capacitor/inductor/or resistor), or may be implemented as a multi-component printed-circuit board (PCB), or any combination thereof. A monolithic IC implementation is most desirable for the lowest cost and highest field reliability. Key considerations for a RAMS power electronics circuit include circuit footprint and thickness (profile), implementation cost, impact size, insertion loss, and switching structure. For example, the RAMS power electronics circuit may comprise a silicon CMOS or BiCMOS (bipolar+CMOS) integrated circuit. RAMS implemented as a CMOS power electronics integrated circuit may be lower cost and dissipate less power as compared to other options (such as compared to the multi-component PCB option) and depending on other consideration factors. The exemplary RAMS structures disclosed herein are based on a circuit design which may be implemented either as a multi-component power electronics circuit (such as arranged in a small printed circuit board or PCB) or monolithically formed using a CMOS power electronics baseline foundry process supporting analog and digital functions. Further, to reduce cost, the exemplary RAMS structures provided herein are CMOS silicon based circuit designs without non-volatile memory function although non-volatile memory components (such as flash memory) may also be utilized. The use of monolithically-isled (or monolithically tiled) solar cells with scaled down currents and scaled up voltages may further reduce the implementation cost and insertion loss of the RAMS power electronics circuit embodiments of this invention.

The RAMS power electronics circuit provides an ON/OFF power delivery switching gate embedded within the module laminate. In one embodiment, the RAMS gate is toggle switch utilizing non-volatile embedded memory. However, to reduce the RAMS power electronics circuit footprint and also the additional costs associated with embedded memory, the switch may be dynamically and remotely commanded by a power line communication PLC AC pulse train external to the module. In other words, presence of an external signal such as an AC pulse train on the PV system power line commands the RAMS gate switch to enable module power delivery (or the gate switch being ON because the internal RAMS bypass switch is turned off) and the absence of an external signal such as an AC pulse train on the PV system power line commands the RAMS switch to disable module power delivery (or the gate switch being OFF because the internal RAMS bypass switch is turned on). For example, unless the RAMS chip receives pulse (such as the AC pulse train on the power line) from the external power line the RAMS gate switch is and remains OFF (i.e., in a parallel switch gate embodiment the bypass switch closes/shorts the module current and power delivery from the module is disabled by the gate switch). And when and for as long as the RAMS power electronics circuit receives an AC pulse train, the RAMS gate switch is and remains ON (i.e. in a parallel switch gate embodiment the bypass switch is open and module power is delivered to the external module leads). Thus, the external signal (AC pulse train on the PV module array power lines) acts as a stay-on command signal for all the embedded RAMS power electronics circuits—as long as the AC pulse train is present and is detected on the power line, the RAMS gate switch is and remains ON (enabling module power delivery).

The command signal generator (e.g., AC pulse train generator or an AC continuous wave generator) may be a stand-alone component or part of an array control system which may also include the power inverter (such as a string inverter or a plurality of string inverters) for the PV array (e.g., string inverter). The command signal may be provided by an AC pulse train generator comprising an AC power line signal/power line communication PLC (for example having a frequency in the range of about 10 kHz up to about 10 MHz, and in some instances in the range of about 50 kHz up to about 1 MHz) with amplitude modulated with a relatively low-frequency, small duty cycle square wave to send AC pulse packets to the RAMS power electronics circuit. The frequency of square wave modulation signal (or the frequency of the AC pulse train) may be selected to be in the range of about 0.05 Hz up to 10 Hz (for instance, a frequency of 0.1 Hz modulation). As long as the PV array RAMS circuit detects the AC pulses at least once every X seconds (for the square wave period of T seconds), the PV array modules remain on and continue to deliver the power to the central inverter. X may be choose to be larger than T for fail-safe redundancy purposes. For instance, for T=10 seconds, X may be chosen to be a multiple of T such as X=30 seconds to 60 seconds. This level of redundancy ensures continued operation and fault tolerance of the PV array even if some pulsed are "missed" by the RAMS power electronics detection circuits (for instance, due to power line noise). However, X may also be sufficiently small (for instance, no longer than 1 minute) such that in case of emergency (for example a fire hazard or any other electrical safety emergencies), the PV array may be turned off (i.e., RAMS gate switches disabling power delivery) within about 1 minute (or a shorter time). Thus suitable compromise for the PV array may be X=30 seconds (and T=5 seconds to 10 seconds). The PV array may also use an additional layer of redundancy, for instance, by using more than 1 master AC pulse train generators operating at somewhat different frequencies and all recognized by the RAMS power electronics circuit (for instance at frequencies of 1 MHz to 3 MHz or 100 KHz to 300 KHz).

Figure 2:
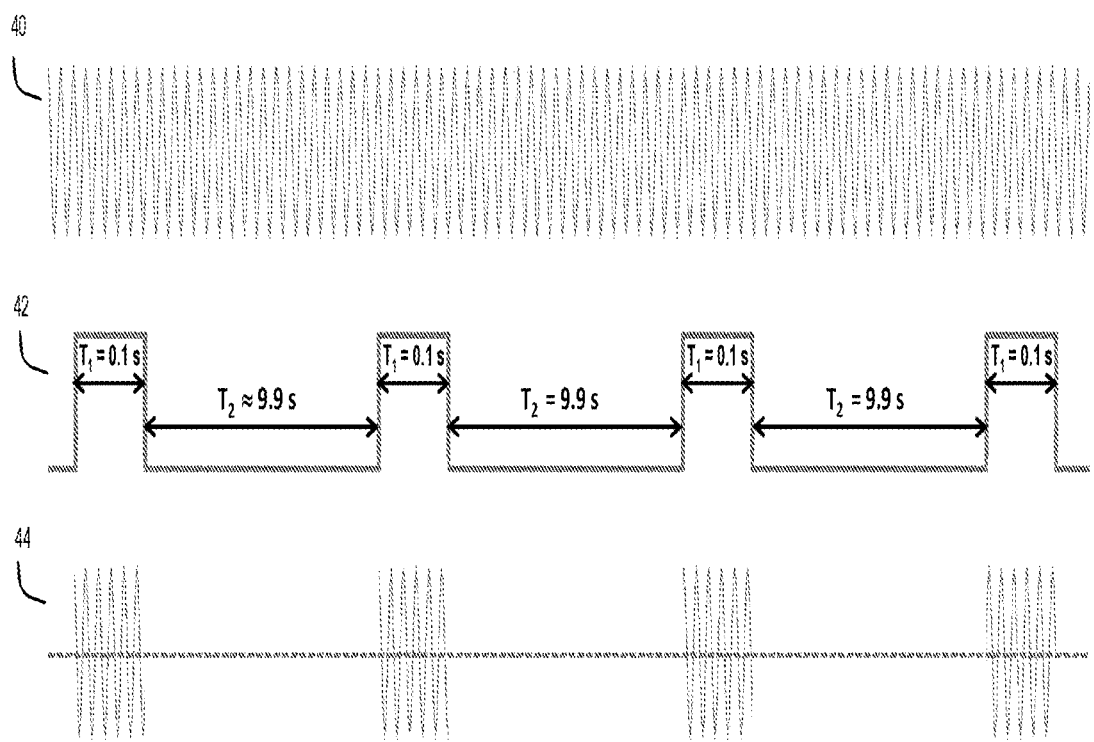
FIG. 2 is a diagram depicting continuous AC signal, and an exemplary modulation signal and resulting AC pulse train.

FIG. 2 is a diagram depicting continuous AC signal 40, and an exemplary modulation signal 42 and resulting AC pulse train 44 which may be sent on the PV array power lines from a central PACS dispatch unit to control the embedded RAMS power electronics circuits within the array module laminates (and to enable the power delivery from the modules to the load). Continuous AC signal 40 represents a continuous relatively low-power/low-voltage AC signal (e.g., about 50 KHz to 1 MHz) source before modulation. Modulation signal 42 represents a relatively small duty cycle (e.g., a fraction of % up to about 1.0%), low frequency (e.g. 0.1 Hz) square wave modulation signal used to modify a continuous AC signal to pulse packets sent to the RAMS power electronics circuit. AC pulse train 44 represents a resulting square-wave-modulated low power/low voltage AC pulse train sent on installed PV module lines to the RAMS power electronics circuit. In other words, a central controller sends a pulsed AC signal, modulated by a small-duty-cycle very-low-frequency square wave (for example AC signal frequency $f_{RF}$=1 MHz, square wave modulation frequency $f_{mod}$=0.10 Hz, duty cycle D=1.0%), to command the RAMS power electronics circuit to deliver power. Conversely, absence of the AC pulse train indicates an implied command to shut off the PV array modules (by turning on the internal bypass switches of the embedded RAMS power electronics gate switches within the module laminates and disabling power delivery from such modules). Thus, not using non-volatile memory with the RAMS provides increased anti-theft functionality (module is effectively inactivated once removed from the PV array). In other words an active power line communication (PLC) signal may command the RAMS gate switch to deliver power for as long as the module remains connected to the PV array; however, if and once the module is removed from the PV array, power delivery by the affected module is disabled due to the internal RAMS gate bypass switch being turned on and internally shunting the module current. In some instances, it may be necessary to shunt power delivery from the module during normal operation (e.g., when the modules are producing power during day time)—in this case the PACS unit may stop sending the active pulse train to the modules via the power line communication (PLC). While our primary embodiments provide blanket remote module switching capability (i.e., PACS can turn on and off all the modules on the array using blanket AC pulse train signal), it's also possible to make the switching function addressable by each module. In other words, it's possible to turn on or off each module on the array by an addressable command via PLC (for instance, each module having a unique AC pulse train associated with it, for instance with a unique frequency). In another embodiment, embedded memory may be utilized to toggle the RAMS gate switch ON/OFF as well. However, using non-volatile memory may reduce the anti-theft feature of the active command (for instance, if/when a module is disconnected from the array while the module is enabled for power delivery with the non-volatile, memory programmed to be in the power-delivery-enabled state), unless a more complicated and costly RAMS design is utilized.

Figure 3:
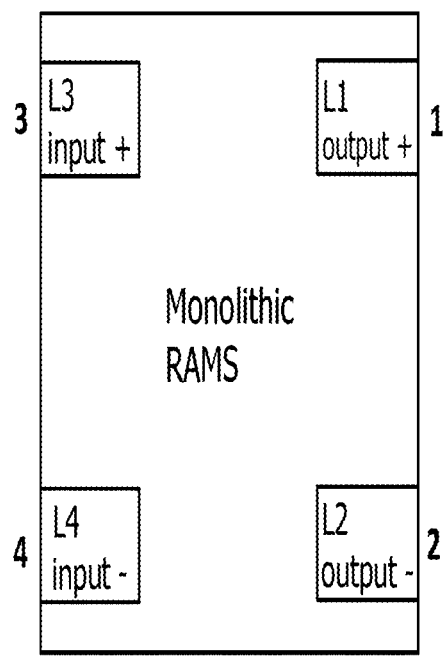
FIG. 3 is a level schematic of a RAMS chip having four terminal leads or pads (two input terminals and two output terminals)

FIG. 3 is a level schematic of a RAMS power electronics circuit shown in a single package (such as a monolithic integrated circuit or a small PCB) having four terminal leads or pads. The disclosed RAMS power electronics circuit may utilize surface mount technology or connect to the internal module output terminals and the external module output terminals via bussing connectors. The monolithic RAMS power electronics circuit of FIG. 3 comprises positive module output terminal L1 and negative module output terminal L2, and positive RAMS input terminal L3 and negative RAMS input terminal L4 (L3 and L4 being the internal module outputs connected to the RAMS power electronics circuit). Specifically and preferably, the RAMS power electronics circuit of FIG. 3 is a thin-profile package (e.g., <2 mm and preferably <1 mm) SMT (surface mount technology) package with at least three (one common) or four I/O terminals (may be leads or pads) designed to accommodate both higher voltage and lower voltage modules. In other words, the RAMS power electronics circuit may be designed to operate with lower voltages and higher currents and vice versa. As noted previously, the RAMS power electronics circuit embodiments may be implemented as monolithic integrated circuit package (e.g., a CMOS IC without any external discrete components) or as a System in a Package (SIP), or as a hybrid package with core monolithic and discrete components, or as a multi-component PCB. Preferably, the RAMS power electronics circuit embodiments of this invention may be implemented as a CMOS IC fabricated using a medium/high-voltage baseline CMOS manufacturing process in order to reduce the final implementation costs (in some instances reducing costs in volume to less than about US$1 per RAMS chip per PV module).

It is important to note the embedded module power control systems of the present application may utilize a single RAMS chip per module or multiple RAMS chips per module (e.g., one RAMS chip per sub-string of interconnected cells with at least two sub-strings of solar cells within the module laminate). Further, the RAMS power electronics circuit itself may have a varying number of input and output terminals (with either symmetrical or nonsymmetrical input/output terminal structures). Thus, the internal module to RAMS circuit connection structure may be designed and optimized in varying combinations.

Figure 4:
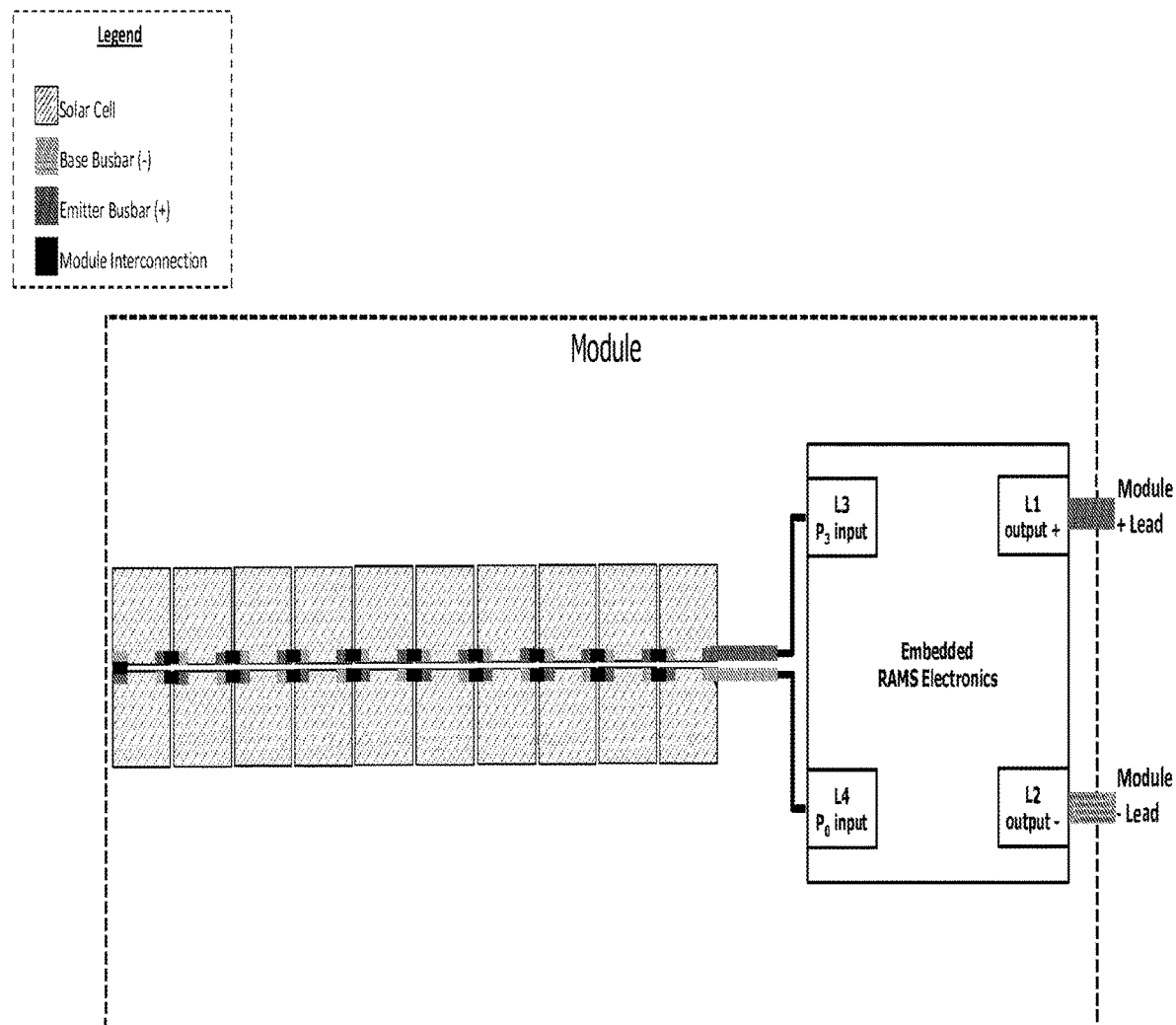
FIGS. 4 through 6 illustrate such design versatility using a four terminal RAMS chip.
Figure 5:
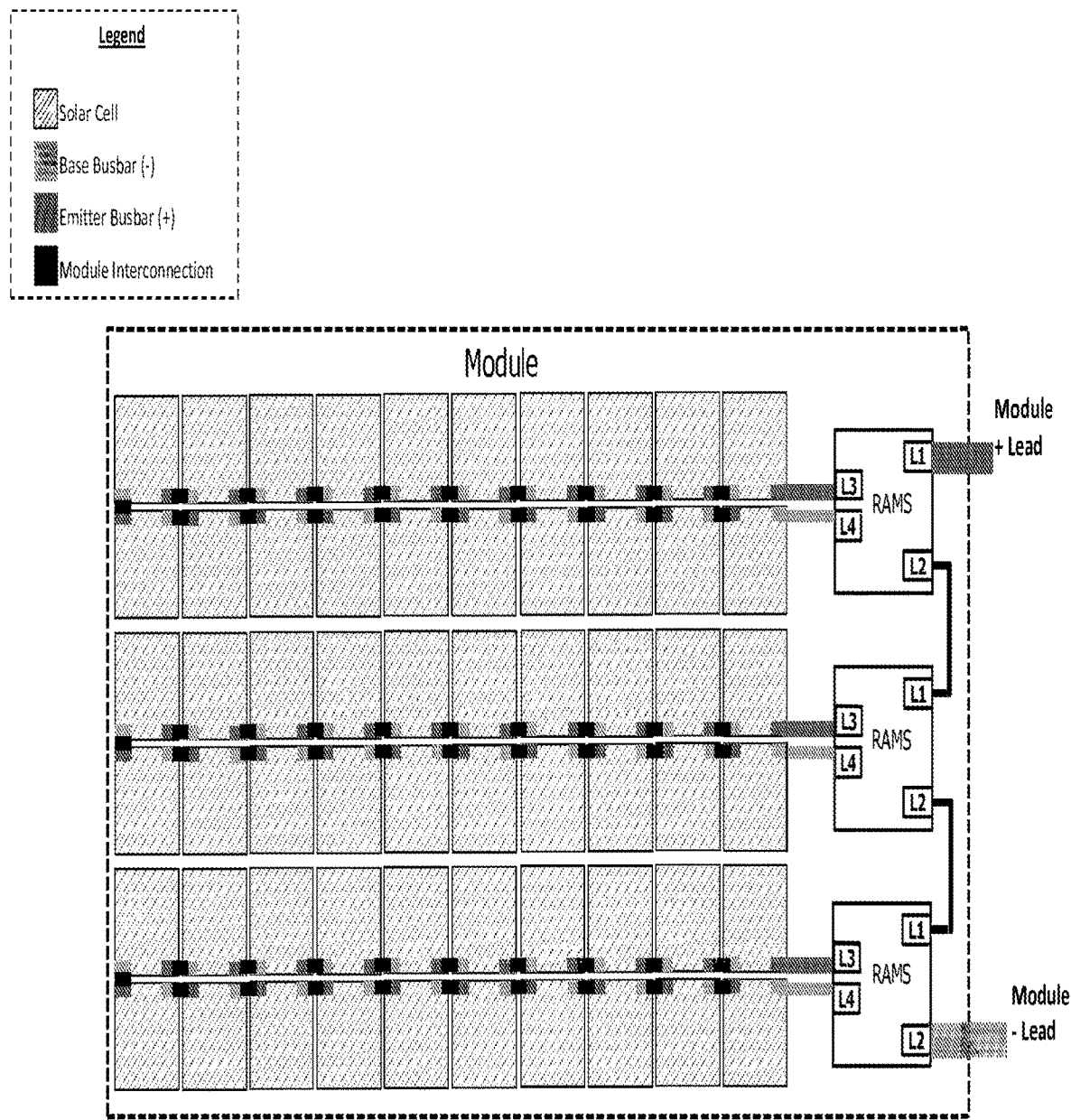
Figure 6:
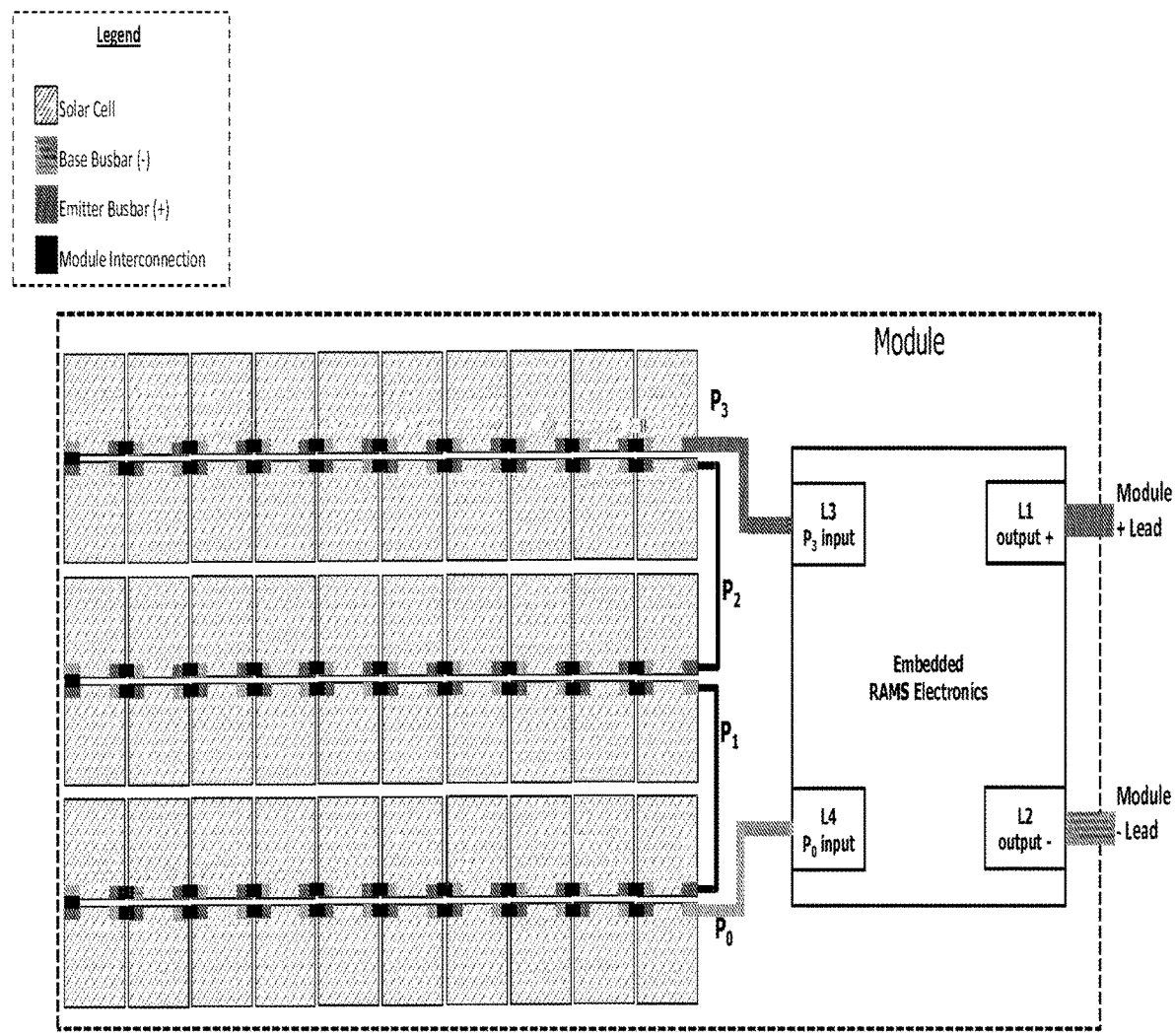

FIGS. 4 through 6 illustrate such design versatility using a four terminal RAMS chip (of varying voltage constraints depending on cell/array requirements).

FIG. 4 is a diagram of a representative solar module laminate comprising 20 series connected solar cells and an embedded lower voltage four lead RAMS power electronics circuit package (e.g., a monolithic RAMS IC or a PCB). A 20 cell module will typically produce lower voltage (compared to a 20 cell module) and the embedded low-cost RAMS electronics design may work with a PV module comprising any number of solar cells with lower module voltages up to approximately 1 00V.

FIG. 5 is a diagram of a representative solar module laminate comprising three sets of 20 series connected solar cells (60 cells total) each with an embedded RAMS electronics (e.g., a monolithic RAMS IC or SIP) such as that shown in FIG. 4. As shown in FIG. 5, the RAMS output are connected in series resulting in two external module leads (one positive and one negative). Alternatively, each RAMS power electronics circuit may provide external module positive and negative lead (i.e., resulting in six total module leads applied to the module of FIG. 5). The voltage constraints of the RAMS of FIGS. 4 and 5 may be modified depending on other considerations such as module structure, cost, and insertion loss of various components.

FIG. 6 is a diagram of a solar module laminate comprising 60 series connected solar cells and embedded higher voltage four lead RAMS electronics package (e.g., a monolithic RAMS IC or SIP or PCB). A 60 cell module will typically produce higher voltages (compared to a 20 cell module) and the embedded RAMS power electronics circuit design may work with a PV module comprising any number of cells with module voltages up to hundreds of volts. These voltages are representative values of modules comprising monolithically-isled (or monolithically-tiled) solar cells with scaled-down currents and scaled-up voltages. The reduced electrical currents of the solar cells and the resulting cell string and module result in design of the RAMS power electronics circuit for lower current (depending on the current/voltage scaling factor), and hence, enabling reduced RAMS footprint, insertion losses, and cost.

In addition to the various module connection designs (such as a 60 cell all series connection or a 60 cell hybrid parallel connection shown in FIG. 5), solar cell structure and design may also be used to modify the voltage and current constraints of the embedded RAMS electronics in order to achieve a higher PV system efficiency and lower RAMS implementation costs.

Figure 7:
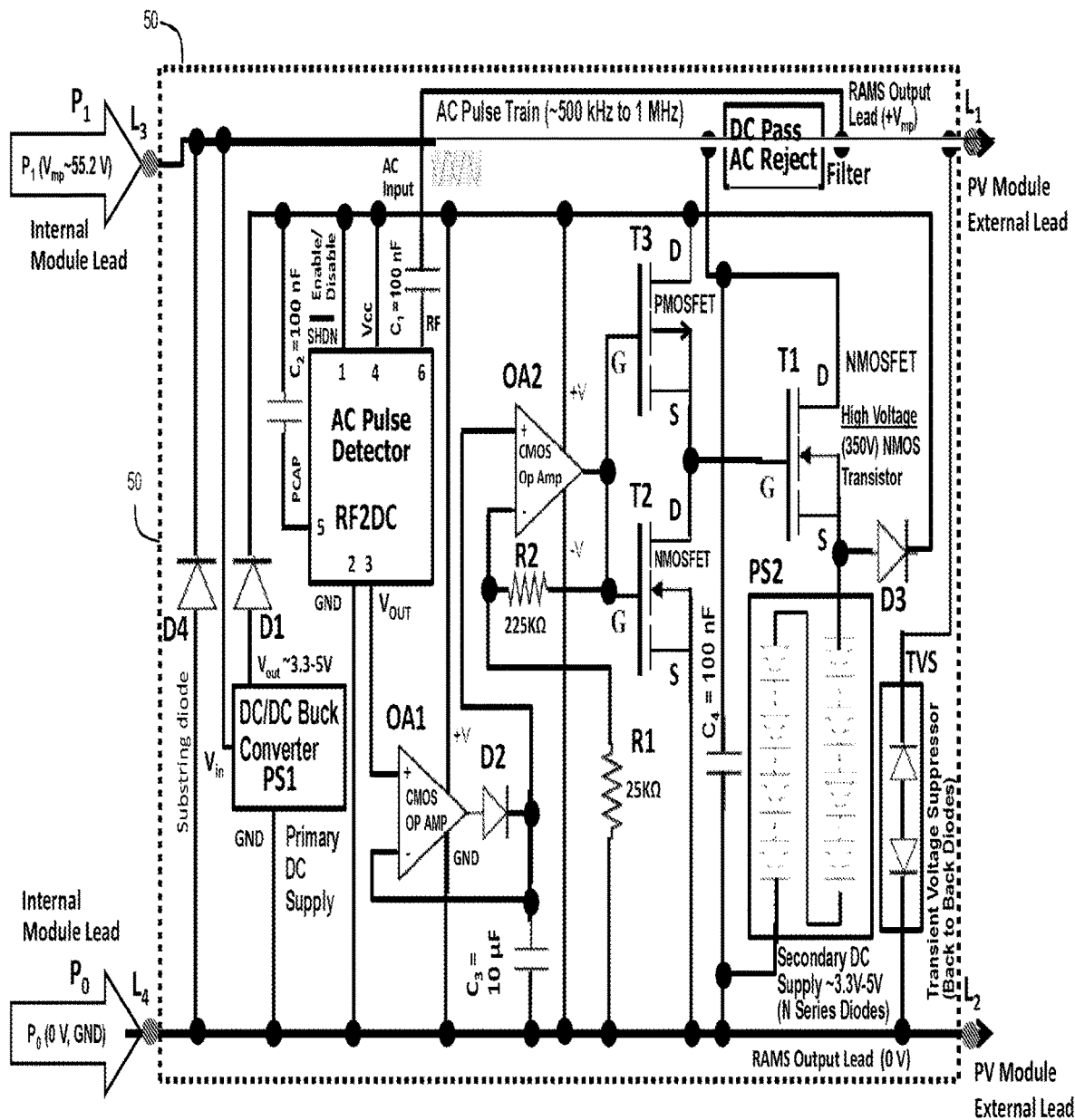
FIG. 7 is a high-level functional schematic representative circuit diagram showing a module powered embedded RAMS power electronic circuit embodiment.

FIG. 7 is a high-level functional schematic representative circuit diagram showing a module powered embedded RAMS power electronics circuit 50 having two internal module leads (L3 connected to internal module terminals P3 and L4 connected internal module lead $P_0$) and two output terminals (L1 and L2). The circuit of FIG. 7 may act as a representative circuit of the RAMS power electronics circuit shown in FIGS. 3 and 4. The circuit diagram of FIG. 7 comprises the core switch gate MOS transistor T1 driven by switch driver CMOS transistors T2/T3 (if the driver T2/T3 output level is high, T1 is ON and shunts electrical current of the module—disabling module power delivery, and if the pulse train is delivered and detected by the RAMS circuit, T1 is OFF and module power is delivered to the load in the PV array) as well as optional functional blocks TVS (transient voltage suppressor) and substring bypass diode D4 among others. The CMOS circuit of FIG. 7 may be designed for a relatively lower-voltage (e.g., up to about 100V) module—representative module voltages shown. In the example shown, T1 is a relatively high voltage MOS transistor such as an NMOS transistor switch and most of the other circuit components are relatively low voltage internal pulse detection and gate switch control circuitry. The AC Pulse Detector shown may be an RF power detector (shown as RF2DC) circuit. Description of the functionalities of the circuit diagrams shown in FIGS. 7, 12, and 13 are provided in Table 1 below.

TABLE 1

Figure 12:
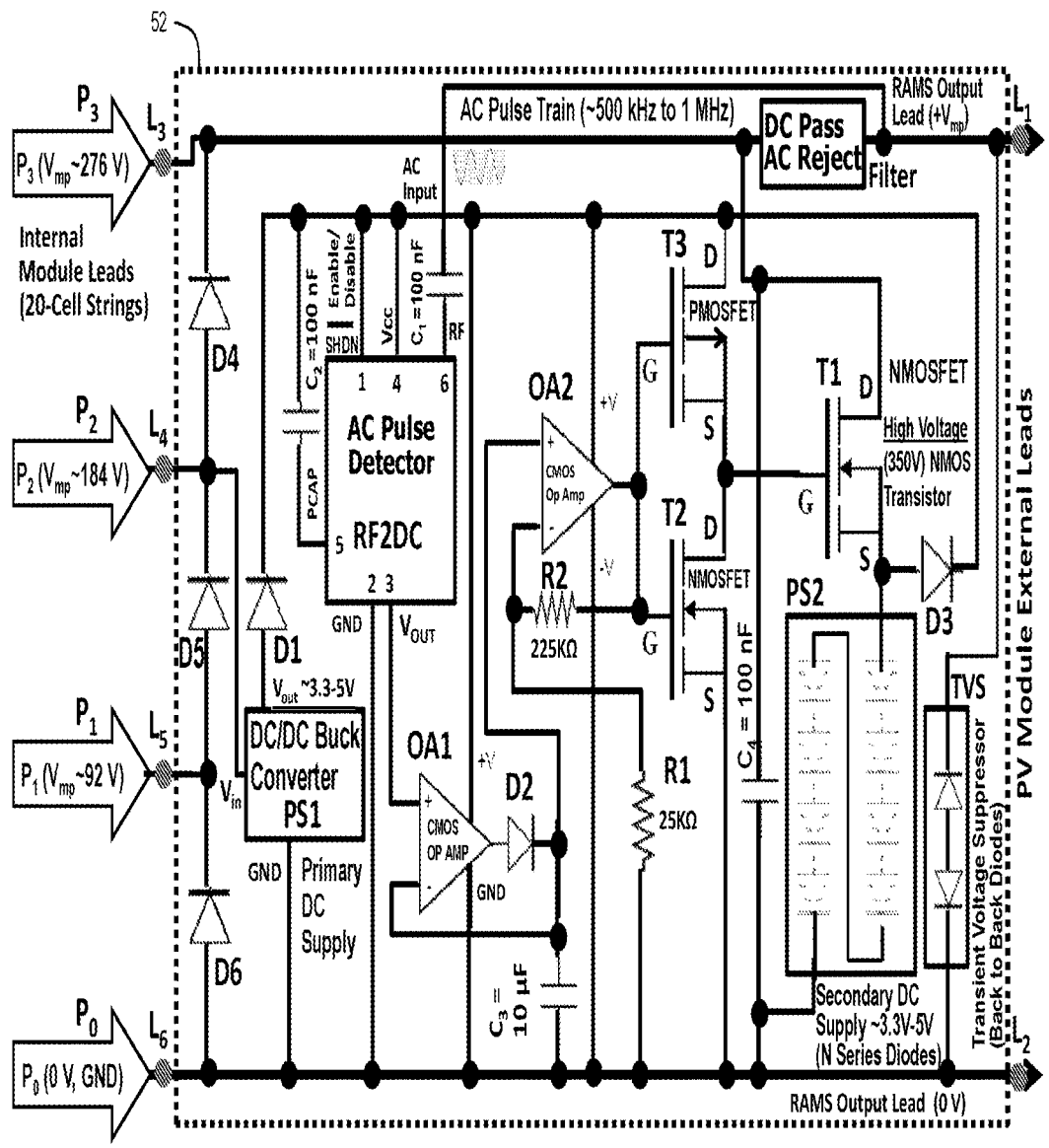
FIGS. 12 and 13 are high-level functional schematic representative circuit diagrams showing a module powered embedded RAMS circuits.
Figure 13:
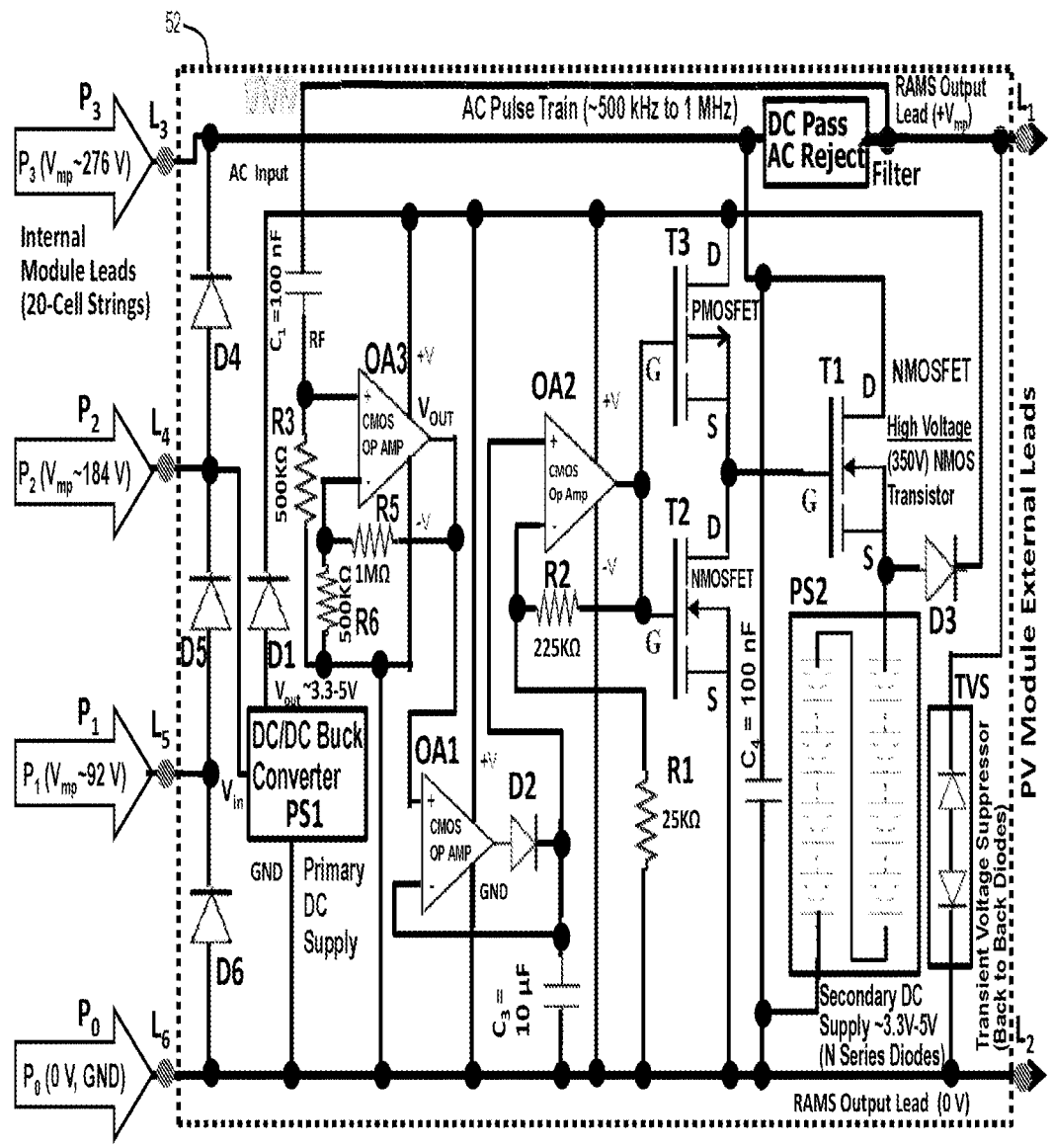

Description of components in FIGS. 7, 12, and 13

| Blocks | Functionality |
|---|---|
| PSI, DI | PS1 is the primary internal power supply using a DC-to-DC buck converter. This is the primary DC supply, delivering power (~3 to 5 V) to the RAMS chip when the module is ON and delivering PV power to the load. D1 is a diode which protects PS1 when the module is turned OFF. |
| RF2DC, Cl, C2 | These components form the AC power detector. The RF/AC (e.g., 500 kHz to 1 MHz) pulse on the power line is detected & converted to a DC pulse ($V_{out}$). The AC pulse train is sent on the DC lines from central inverter or a separate oscillator. |
| OA1, CD2, and C3 | OA1 is a CMOS op amp which together with D2 and C3 forms a non-inverting sample & hold circuit. Its input receives the output of the RF to DC power detector and holds the voltage with a slow decline as set by the C3 capacitor. |
| OA2, R1, R2 | OA2 is a CMOS op amp and together with RI and R2 forms a non-inverting hi-input-impedance amplifier (gain = 10) receiving the output of the sample & hold circuit and producing a square wave pulse at its output. Once the sample & hold voltage falls below a threshold (no RF pulse train), the output of OA2 drops to 0. |

TABLE 1-continued

Description of components in FIGS. 7, 12, and 13

| Blocks | Functionality |
|---|---|
| Filter, C4 | This is a simple RF Reject/DC pass-through filter, for instance, made of a parallel inductor-capacitor filter with a parallel resonant frequency set at the RF (AC) frequency (e.g., 500 kHz to 1 MHz). It decouples the PV module cells and the RAMS output switch from the RF pulse train on the DC power line. C4 is a bypass filter shunting any residual RF leakage across the switch. |
| T2, T3 | This is the CMOS driver for the high-voltage switch. It receives the output of the OA2 op amp circuit at its input and rives the high-voltage transistor Tl. |
| Tl | This is the high-voltage enhancement-mode MOSFET, driven by T2/T3 driver. |
| PS2, D3 | PS2 is the secondary internal power supply using a diode array. This is the secondary power (~3 to 5 V) to the RAMS chip when the module is OFF. D3 is a diode which protects PS2 when the module is turned ON. |
| TVS | This is the Transient Voltage Suppressor (TVS) which, in a simple form, may be made a pair of back-to-back pn-junction diodes with a combined reverse breakdown voltage above the maximum (open-circuit) voltage of the PV module (for instance, at least ~350 V for 60-cell module shown). The TSV block is placed within RAMS across its output leads and protects both the RAMS circuit and the PV module solar cells against both lightning surge and ESD. |
| D4, D5, D6 | These diodes provide RAMS-based embedded shade management for the module sub-strings. |

Figure 8:
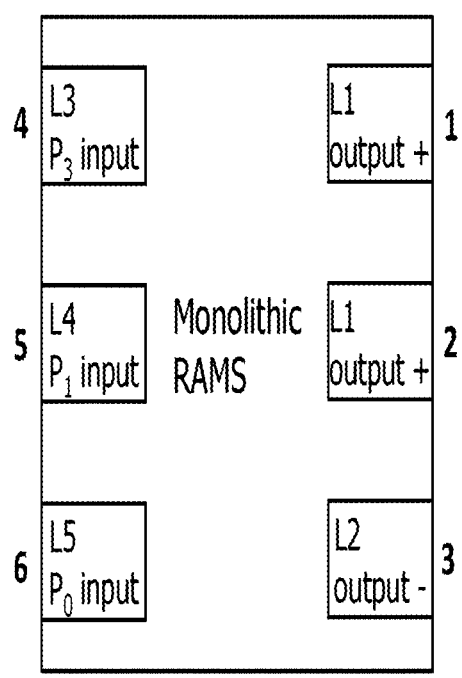
FIG. 8 is a level schematic of a RAMS chip having six terminal leads or pads for connections to multiple connection points from the string of interconnected solar cells.

FIG. 8 is a level schematic of a RAMS chip having six terminals (e.g., leads or pads). The disclosed RAMS chip may utilize surface mount technology for direct attachment onto a backplane or connect to module electrical bussing input and outputs via bussing connectors. The monolithic RAMS power electronics circuit of FIG. 8 comprises two positive RAMS output L1 terminals (which may be connected together prior to external module power delivery) and negative RAMS output L2, and positive RAMS input L3 and negative RAMS input L4 and L5. In other words, the RAMS power electronics circuit of FIG. 8 is shown with three output leads (shown with redundant lead output terminal L1) for symmetry but in another embodiment the two positive L1 output leads may be internally connected. Specifically, the RAMS power electronics circuit of FIG. 8 may be a thin-profile (e.g., <1 mm) SMT (surface mount technology) IC with five or six I/O pads designed to accommodate both higher voltages and lower voltage modules. In other words, the RAMS power electronics circuit may be designed to operate with lower voltages and higher current and vice versa. In one instance, for lower voltage modules leads L4 and L5 may be connected. As noted previously, the RAMS chip implementation may be implemented as monolithic (no external discrete components) or System in a Package (SIP), or hybrid package with core monolithic and discrete components, or as multi-component PCB. A monolithic implementation is performed using a CMOS IC manufacturing process for high performance, low insertion losses, and low cost.

Figure 9:
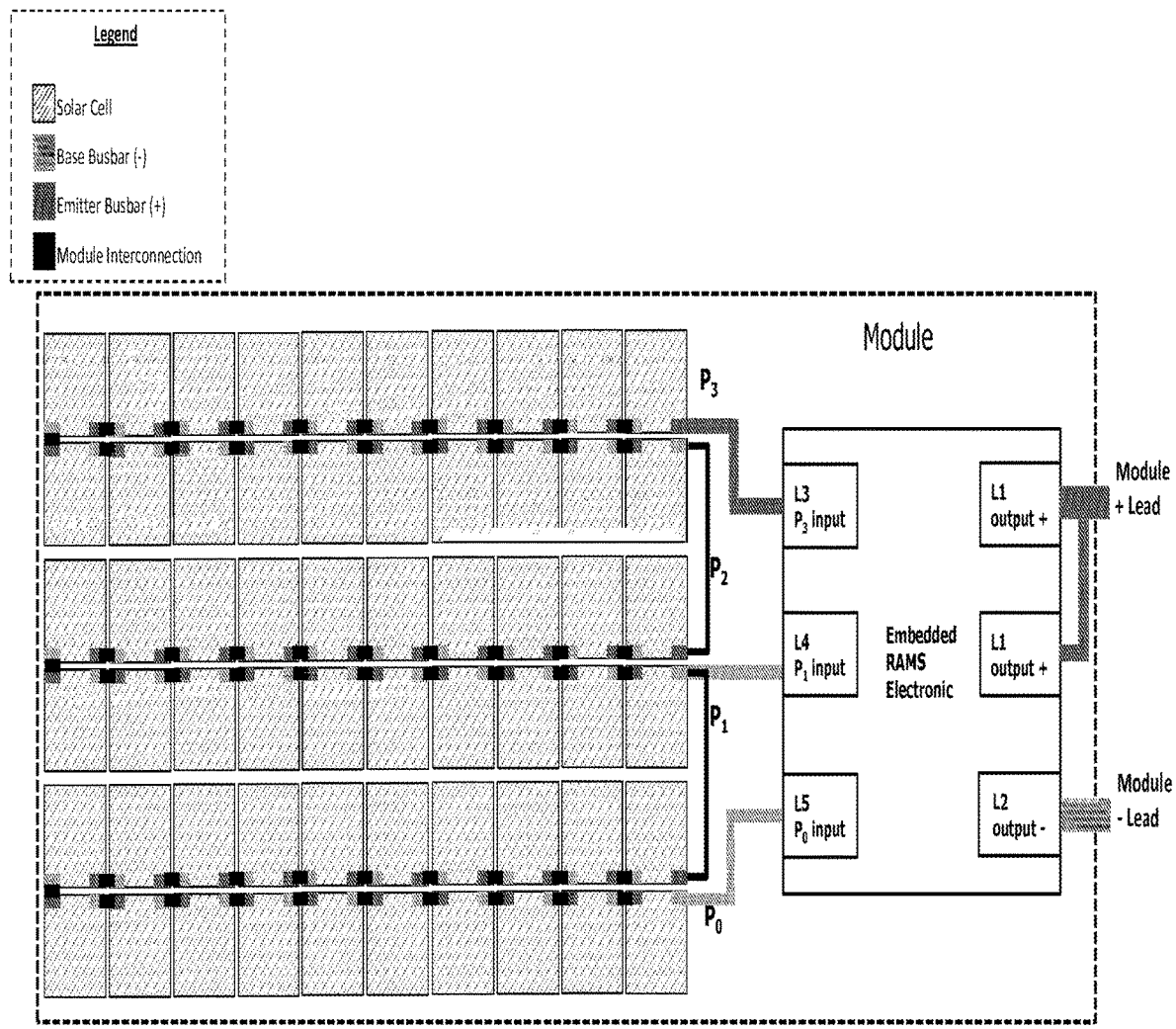
FIG. 9 is a diagram of a solar module laminate using an embedded RAMS power electronic circuit.

FIG. 9 is a diagram of a solar module laminate comprising 60 series connected solar cells and embedded higher voltage a six lead RAMS power electronics package (e.g., a monolithic RAMS IC or SIP or PCB) such as that shown in FIG. 8. A 60 cell module will typically produce higher voltage (compared to a 20 cell module) and the embedded RAMS electronics design may be designed to work with a PV module comprising any number of cells with module voltages up to hundreds of volts (particularly and for instance when using monolithically-isled or monolithically-tiled solar cells with scaled-up voltages and scaled-down currents, resulting in reduced system-level losses and enabling lower cost RAMS implementation).

Figure 10:
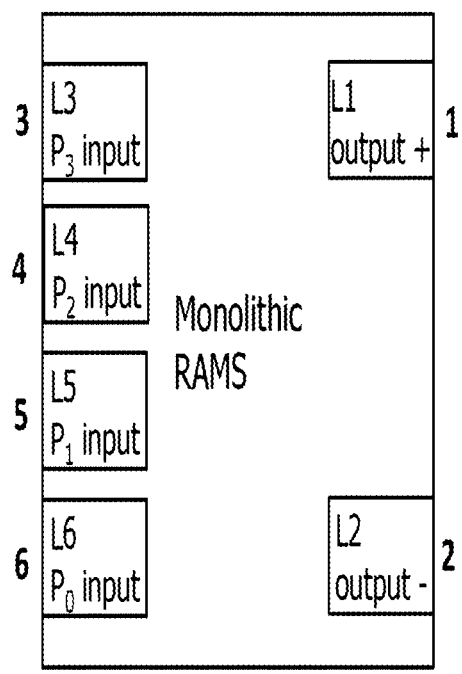
FIG. 10 is a level schematic of a RAMS chip having six terminal leads or pads (comprising four input terminals and two output terminals)

FIG. 10 is a level schematic of a RAMS power electronics circuit package (e.g., either a monolithic package or an SIP or a PCB) having six terminals (e.g., leads or pads). The disclosed RAMS power electronics circuit may utilize surface mount technology or connect internally to the embedded solar cells within the module using electrical bussing connectors to the input and output terminals on the RAMS circuit package. The RAMS power electronics circuit of FIG. 10 (e.g., monolithic IC or SIP or PCB package) comprises positive RAMS output L1 (corresponding to the positive module output terminal) and negative RAMS output L2 (corresponding to the negative module output terminal), and positive RAMS inputs L3 and LS (from the string of electrically interconnected solar cells) and negative RAMS inputs L4 and L6 (from the string of electrically interconnected solar cells). In other words, the RAMS chip of FIG. 10 has an asymmetrical lead design with two output leads and four input leads. Of course, the same RAMS power electronics circuit package (e.g., monolithic IC or SIP or PCB package) with 6 terminals may be arranged to have alternative terminal arrangements on the package (either as pads or as leads). Specifically, the RAMS power electronics circuit of FIG. 10 is a thin-profile (e.g., <2 mm and preferably <1 mm) package with six I/O terminals arranged as pads or leads designed to accommodate both higher voltage and lower voltage modules (for instance with module string voltages in the voltage range of 10's of volts to 100's of volts). In other words, the RAMS power electronics circuit may be designed to operate with lower voltages and higher current and vice versa (i.e., with higher voltages and lower currents such as with monolithically-isled or monolithically-tiled solar cells with scaled-down currents and scaled-up voltages). As noted previously, the RAMS power electronics circuit may be implemented as a monolithic integrated circuit (i.e., without any additional discrete components) or System in a Package (SIP), or hybrid package (for instance, packaged in a PCB) with a core monolithic IC and additional discrete components, the core IC being fabricated using CMOS IC process technology capable of handling the desired voltage and current ranges.

Figure 11:
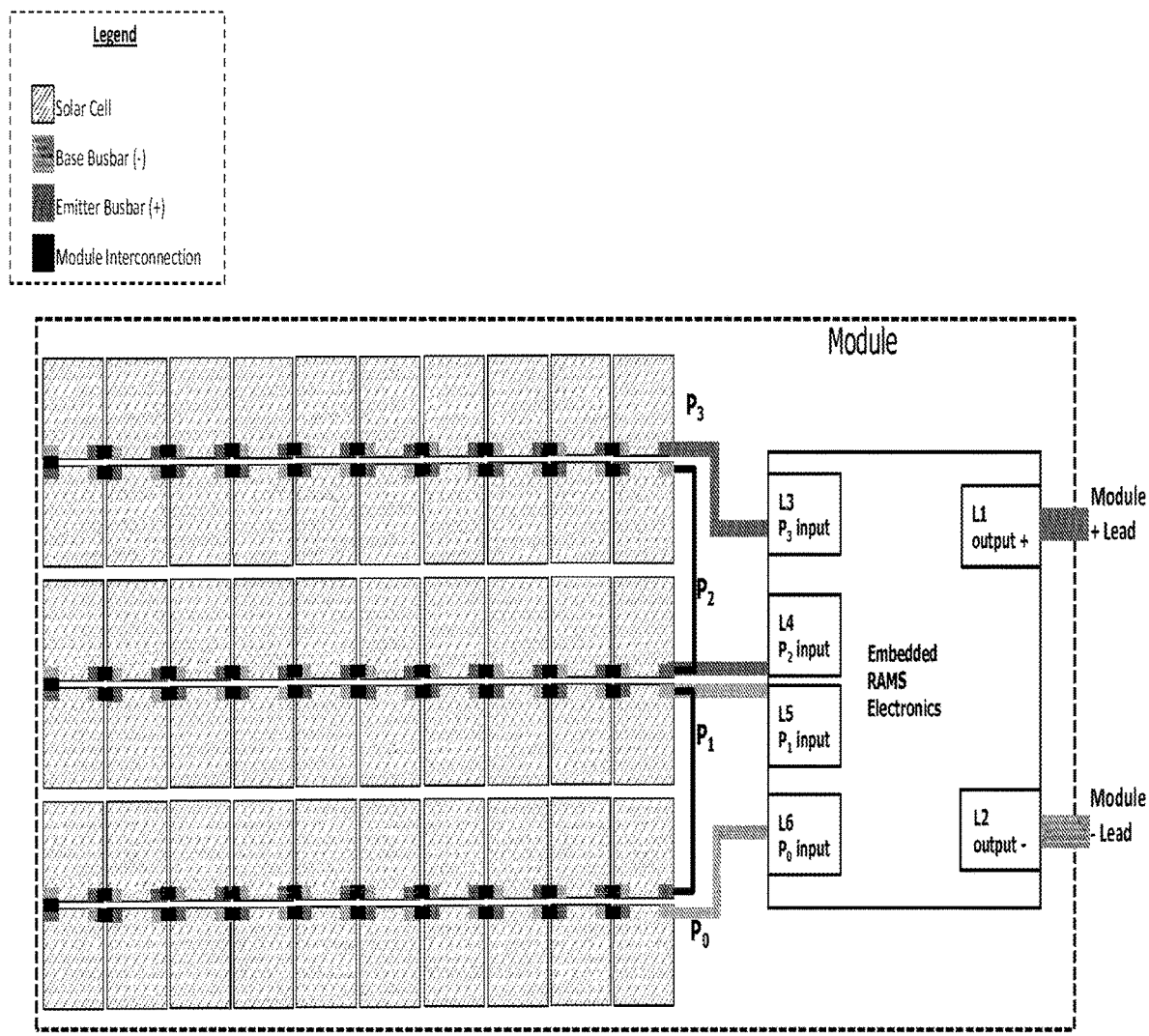
FIG. 11 is a diagram of a solar module laminate with an embedded RAMS power electronic circuit.

FIG. 11 is a schematic diagram of a solar module laminate comprising 60 series connected solar cells and an embedded higher voltage six-terminal RAMS power electronics circuit package (e.g., a monolithic RAMS IC or SIP or PCB) such as that shown in FIG. 10. The relative dimensions of the module, the solar cells, and the RAMS power electronics circuit package are not shown to scale A 60-cell module with series-connected solar cells will typically produce higher voltage compared to a module with fewer number of solar cells connected in series (for instance, compared to a 20-cell module) and the embedded RAMS power electronics circuit design may work with a PV module comprising any number of cells with module voltages from tens up to hundreds of volts.

FIG. 12 is a high-level functional schematic representative circuit diagram showing a module powered embedded RAMS circuit 52 having four internal module terminals (L$_3$ of RAMS connected to internal module lead P$_3$, L$_4$ of RAMS connected to internal module lead P2, Ls of RAMS connected to internal module lead P$_1$, and L$_6$ of RAMS connected internal module lead P$_0$) and two output external module terminals (L$_1$ and L$_2$) from the RAMS power electronics circuit. The circuit of FIG. 12 may act as a representative circuit of the RAMS power electronics circuit shown in FIGS. 10 and 11. Embedded RAMS power electronics circuit 52 may be used with a higher voltage (e.g., greater than 100V such as module voltages up to 100's of volts) module—representative module voltages shown. The circuit diagram of FIG. 12 comprises the core switch gate MOS transistor T1 driven by switch driver CMOS transistors T2/T3 (if the CMOS driver T2/T3 output is high, MOS switch T1 is ON and internally shunts the module current, hence, disabling the module power delivery through the RAMS gate switch, and if the pulse train is delivered and detected, MOS switch T1 is OFF, hence, enabling the module power delivery through the RAMS switch gate, and the module power is delivered to the load), as well as optional functional blocks TVS (transient voltage suppressor) and substring bypass diodes D4, D5, D6, among others. The AC Pulse Detector shown may be an RF power detector shown as RF2DC) circuit. Description of the functionalities of the circuit diagrams shown in FIGS. 7, 12, and 13 are provided in Table 1 above.

FIG. 13 is a high-level functional schematic representative circuit diagram showing a module-powered embedded RAMS power electronics circuit 54 having four internal module leads (L$_3$ of RAMS connected to internal module lead P$_3$, L$_4$ of RAMS connected to internal module lead P$_2$, L$_{5\ of\ RAMS}$ connected to internal module lead P$_1$, and L$_6$ of RAMS connected internal module lead Po) and two output leads (L$_1$ and L$_2$ of RAMS) similar to the circuit of FIG. 12 except AC peak detector circuitry is utilized instead of the RF power detector shown in FIG. 12. Description of the functionalities of the circuit diagrams shown in FIGS. 7, 12, and 13 are provided in Table 1 above.

As noted previously, the RAMS gate switch of the present application may utilize a command signal which may be an AC pulse train delivered via the module external power lines (e.g. PV module array power lines, using power line communication or PLC) by a PV array control and status monitoring (PACS) system. For example, the AC pulse train may be generated and dispatched via commercially available programmable signal generators with some or all of the following features: programmable functions and waveform design; sine wave generation (e.g., about 50 KHz to 1 MHz) with the desired power/voltage output; low-frequency/low-duty-cycle square-wave amplitude modulation (AM) capability; remote control capability (such as LAN-enabled remote control of functions); and/or, a programmable waveform editor (such as Agilent IntuiLink arbitrary waveform software) to create desired waveform. The remote-controlled, LAN-enabled signal generator may also utilize an Uninterruptible Power Supply (UPS: charged during normal operation with power from the grid and/or central inverter) to ensure sufficient back-up power. And a single signal generator may be used to control the entire installed PV array or multiple signal generators may be used to control multiple sections of the PV array.

Figure 14:
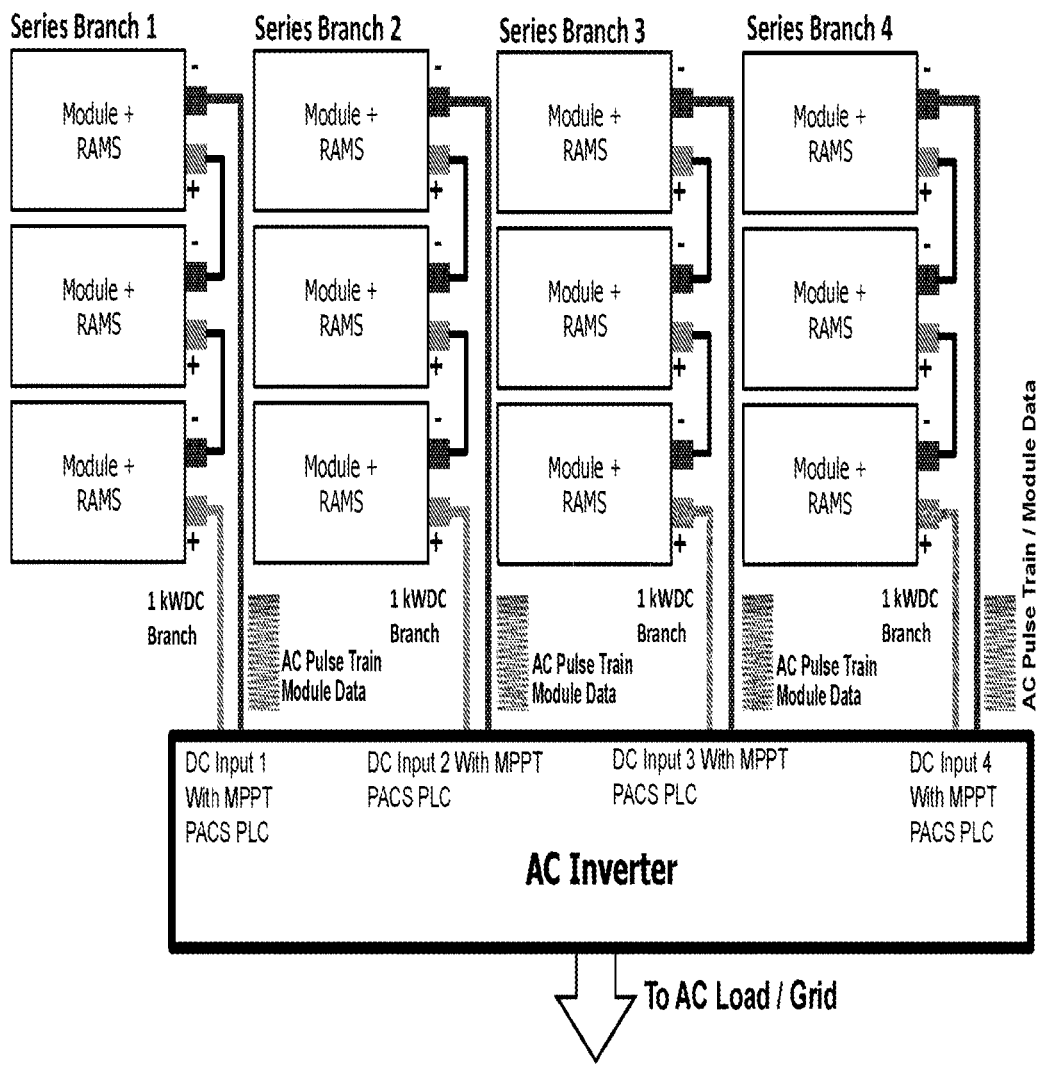
FIGS. 14 through 16 are representative PV system examples using RAMS-embedded modules of this invention in cooperation with PV Array Control and Status Monitoring System (PACS)
Figure 15:
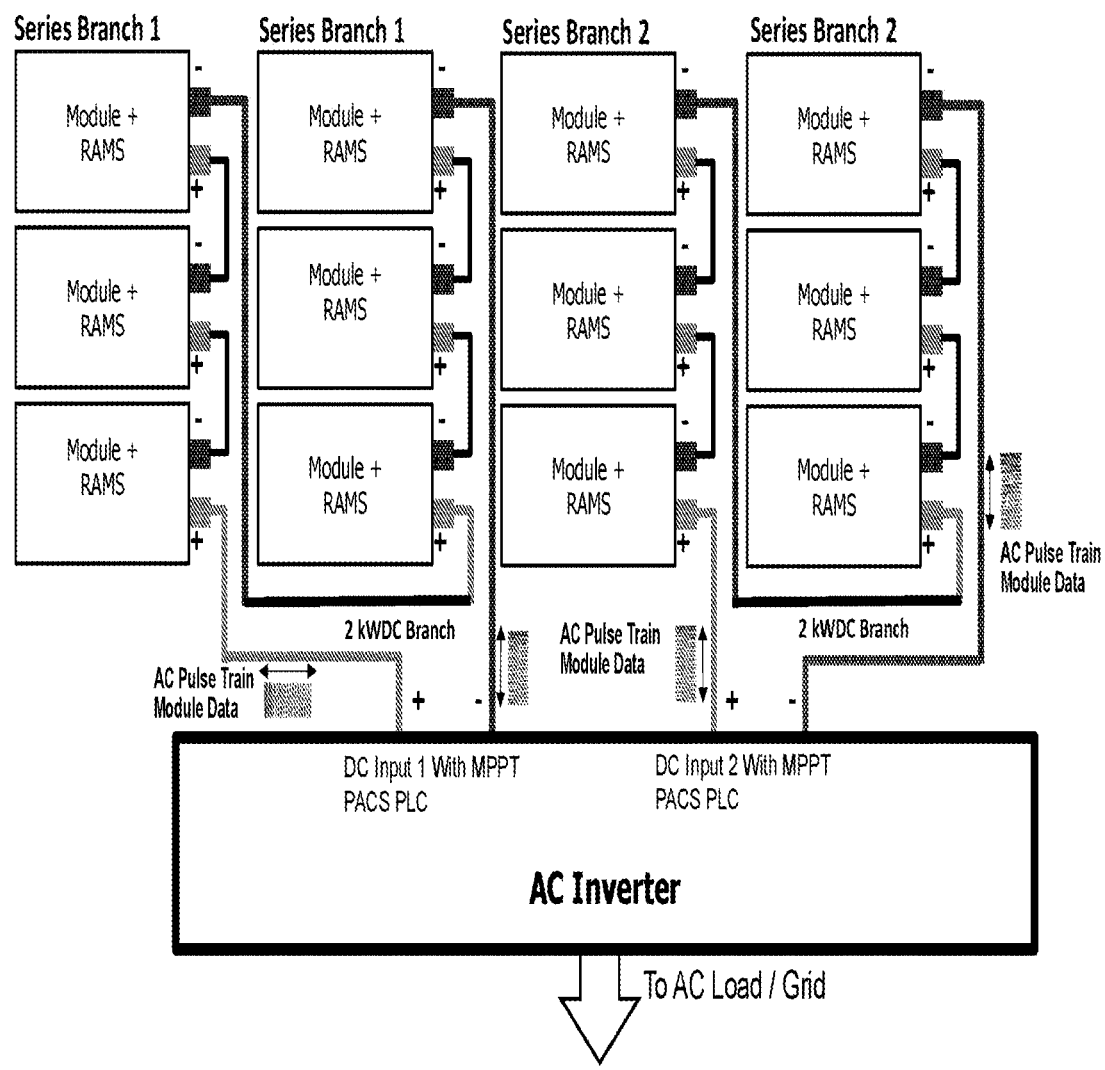
Figure 16:
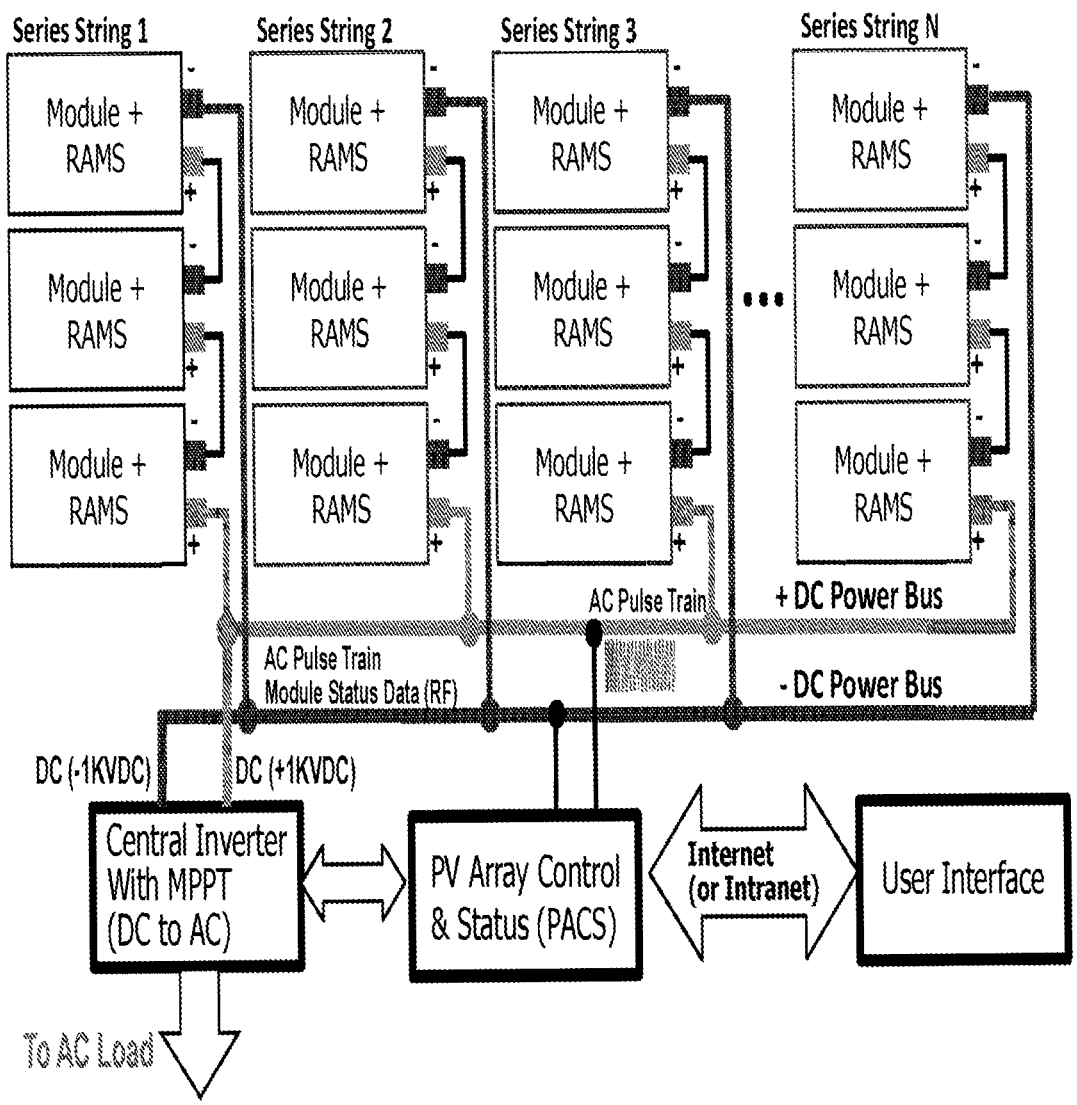

Various PV system configurations may be structured utilizing the embedded RAMS circuitry of the present application in combination with a PV array control and status monitoring (PACS) system (as well as associated maximum power point tracking or MPPT functionality at the module string level). For example, FIG. 14 shows a representative PV system having twelve solar cell modules (e.g., 60 cell modules, each module with at least 300 W peak power) utilizing embedded RAMS and central/remote PACS functionality. The representative PV system shown utilizes three series connected full voltage modules per inverter input (i.e., a four input string inverter). The AC Inverter is a multi-input single (or three) phase approximately 4 KW string inverter, including PACS functionality for RAMS control and data acquisition (e.g., power and temperature measurements by the embedded RAMS power electronics circuits from the PV array modules), and which delivers 120/240 V single phase AC to an AC load such as the power grid. The module connections may be configured in numerous configurations. In this configuration, the representative modules have monolithically-iled (or tiled) solar cells with scaled-down currents and scaled-up voltages (with scaling factor of 8, resulting in solar cells with over 5 V open-circuit voltage and over 1.2 A short-circuit current), resulting in 60-cell modules each with over 300 V open-circuit voltage. Each branch of the string inverter input (with MPPT function at each string inverter input) receives the power from three series-connected solar modules (corresponding to a maximum voltage of about 1,000 Vin each 3-module branch for a 1 KV PV system installation). As another representative example, FIG. 15 shows a PV system having two series-connected branches, each with six series-connected solar cell modules (e.g., 60 cell modules) utilizing RAMS and PACS functionality. In this example, the modules are made using monolithically-isled (or tiled) solar cells with scaled-up voltages and scaled-down currents voltages (but in this case with scaling factor of 4, resulting in solar cells with over 2.5 V open-circuit voltage and over 2.4 A short-circuit current), As a result, each 60-cell module in this example has over 150 V open-circuit voltage. Each branch of the string inverter input (with MPPT function at each string inverter input) receives the power from six series-connected solar modules (corresponding to a maximum voltage of about 1,000 Vin each 6-module branch for a 1 KV PV system installation). The PV system shown utilizes six series connected (half) voltage modules per inverter input (i.e., a two input string inverter, each input having its own dedicated MPPT function for the branch). The AC Inverter in this representative example is a multi-input single (or three) phase approximately 4 KW power string inverter including PACS functionality for RAMS control and data acquisition and which delivers 120/240 V single phase AC to an AC load such as the power grid. In yet another embodiment, the PV system may utilize a central inverter with a central MPPT function and as well as a separate PACS circuit unit, as shown in FIG. 16. In this representative example, the central inverter is connected to the PV module array as the module array is configured as a plurality of parallel branches, with each branch having series-connected solar modules to build the maximum branch voltage to the desired installed PV system maximum allowed voltage. It should be understood from the PV system diagrams presented, the module control systems and the related AC pulse train generator may be implemented in numerous configurations.

In an alternative embodiment, the RAMS gate switch of the present application may utilize embedded non-volatile memory and/or operate via a wireless command signal (instead of PLC) to gate power delivery from the module.

More directly applicable to real-time PV module temperature measurement solutions, the solutions provided for real-time measurements of PV module temperature enables cost-effective real-time measurements of the module temperature such as an effective mean or average module temperature for every PV module in the field-installed PV systems. Effective module temperature refers to the effective weighted temperature of the plurality of solar cells electrically connected within the solar photovoltaic module laminate. Importantly, these solutions do not require infrared (IR) imaging or embedded temperature sensors such as thermocouples or thermistors in the modules.

The remote-access module switch and monitoring circuit and components may be positioned within an electrical junction box attached to a solar photovoltaic module or within the structural laminate of a solar photovoltaic module. The remote access module switch circuit and components for real-time monitoring and measurements of module temperature solutions include but are not limited to: 1) a pair of output electrical leads, and a pair of input electrical leads connected to a pair of electrical power leads of a solar photovoltaic module; 2) a series switch (e.g., advantageously a field-effect transistor, alternatively an electronic component such as a bipolar junction transistor switch), described as an ON/OFF power delivery switching gate previously, placed between the pair of output electrical leads and the pair of input electrical leads, the series switch remotely controllable to be in one of two modes: (i) turned on to allow power delivery from the pair of electrical power leads of the solar photovoltaic module to an electrical load and, (ii) turned off to place the solar photovoltaic module in the open-circuit mode with an open-circuit module voltage across the pair of electrical power leads; 3) a module voltage measurement circuit (e.g., module voltage measurement circuit having a sample and hold circuit in conjunction with an analog digital converter) for periodic real-time measurements of the module voltage as measured across one of the pair of input electrical leads and the pair of output electrical leads during the power generation period by the solar photovoltaic module between its daily wakeup time and sleep time, including periodic real-time measurements of: (i) the open-circuit module voltage when the series switch is turned off and, (ii) the module voltage when the series switch is turned on; 4) a module current measurement circuit (e.g., module current measurement circuit having a current sensing resistor which converts the current to a voltage and subsequently the voltage is amplified using operation amplifier, the voltage is then sent to a sample and hold circuit in conjunction with an analog digital converter) for periodic real-time measurements of the module current flowing through the pair of electrical power leads during the power generation period, including periodic real-time measurements of the module current when the series switch is turned on and the parallel switch is turned off; 5) a temperature sensor (e.g., a thermocouple, thermistor, or an electronic temperature sensor) for periodic real-time measurements of the circuit temperature of the remote-access module switch and monitoring circuit, the circuit temperature being the same as the wake-up ambient temperature at the daily wake-up time of the solar photovoltaic module and the remote-access module switch and monitoring circuit, and the circuit temperature being the same as the sleep ambient temperature at the daily sleep time of the solar photovoltaic module and the remote-access module switch and monitoring circuit; 6) a communication circuit (e.g., a wireless communications circuit or a power line communications circuit) for sending the measurement data to a remote receiver (e.g., a wireless receiver, or a power line communication PLC receiver, with additional function such as data storage such that the remote receiver may also act as a hub to communicate with a cloud server). A parallel switch may be utilized in combination with the series switch for modules connected in series to allow for the string of connected modules to flow and bypass a disconnected modules (i.e., advantageous in the case one module in the series connected string of modules is turned off), the parallel switch (e.g., advantageously a field-effect transistor, alternatively an electronic component such as a bipolar junction transistor switch) is connected across the pair of output electrical leads, the parallel switch remotely controllable to be in one of two modes: (i) turned off to allow power delivery from the pair of electrical power leads of the solar photovoltaic module to an electrical load and, (ii) turned on to short the output electrical leads. The series switch and the parallel switch may advantageously be field-effect transistors. The communications circuit may be a wireless communications circuit (e.g., using a mesh wireless network) or a power line circuit communications circuit. The temperature sensor may be a part of the communication circuit.

An exemplary algorithm for collecting, calculating, and transmitting the real-time effective temperature of a solar photovoltaic module at any operating time during power generation period between the daily wake-up time and sleep time of the solar photovoltaic module may be based on the formula as follows: measuring the solar photovoltaic module open-circuit voltage at the daily wake-up time; measuring the solar photovoltaic module open-circuit voltage at the operating time; measuring the ambient temperature at the daily wake-up time by measuring the temperature of an electronic circuit performing real-time electrical measurements for the algorithm at the daily wake-up time, the electronic circuit co-located with the solar photovoltaic module during power generation operation; subtracting the solar photovoltaic module open-circuit voltage at the daily wake-up time from the solar photovoltaic module open-circuit voltage at the operating time; dividing the resulting voltage value from the prior step by a pre-specified temperature coefficient constant of the solar photovoltaic module, and, adding the resulting temperature value from the prior step to the ambient temperature at the daily wake-up time to provide the real-time effective temperature of the solar photovoltaic module at the operating time during the power generation period.

The real-time monitoring and measurements of module temperature solutions described provide an effective mean or average of the embedded solar cells within each module using the Remote-Access Module Switch (RAMS). RAMS enables remote-access module power ON/OFF switching as well as real-time monitoring of module voltage, current, and RAMS circuit temperature. A RAMS circuit may be advantageously mounted within a PV module junction box. RAMS is designed to provide capability to enable or disable solar power delivery from each module to the load. When RAMS enables power delivery from the module (i.e., Module is ON), RAMS series switch closes (ON) and its output parallel switch opens (OFF), thus placing the module in power delivery condition (e.g., module voltage and current around maximum-power voltage current values). When RAMS disables power delivery from the module (i.e., Module is OFF), RAMS series switch opens (OFF) and its output parallel switch closes (ON), thus placing the module in open-circuit voltage mode and zero current by the module.

The real-time measurements of module temperature for field-installed PV modules is based on the use of RAMS in each module to determine a mean module temperature measurement using a temperature coefficient of the module open circuit voltage. Open-circuit voltage ($V_{OC}$) of the module is a logarithmic function of sunlight intensity. Short-circuit current ($I_{SC}$) and maximum-power current ($I_{MP}$) of the module are approximately linear functions of sunlight intensity. For a given sunlight intensity, open-circuit voltage of a cell (cell $V_{OC}$) has a known dependency (relatively linear with a negative temperature coefficient) on the cell temperature. Open-circuit voltage ($V_{OC}$) of a module (module $V_{OC}$) has the same known dependency (with the negative temperature coefficient of $V_{OC}$ for its cells) on the temperature of its cells, assuming no partial shading in the module.

As the module wakes up and starts to produce voltage and power around sunrise (i.e. dawn) and for minutes thereafter (e.g., for up to approximately 30 minutes after module and RAMS wake-up time), the module temperature $T_{MODULE}$ (defined as the mean temperature of the cells in the module), the temperature of RAMS in the junction box measured by an on-board temperature sensor ($T_{RAMS}$), and the ambient temperature ($T_{AMBIENT}$) are equal around sunrise/dawn: $T_{MODULE}=T_{RAMS}=TT_{AMBIENT}$. The daily average values of "Wake-up Temperature" and "Wake-up Open-Circuit Voltage" along with the corresponding "Wake-up Maximum-Power Current" are used for daily calibration of the module temperature measurement (extraction).

After the module wakes up (i.e., the day progresses into full sunlight), the relative daily time-dependent trends of the PV module (solar cells) temperature and RAMS temperature vs ambient temperature are provided. Throughout the night and until the module and RAMS wake up (e.g., around sunrise/dawn), the module and RAMS are in sleep mode (no PV power generation) and at any moment during this period the module (cells) temperature ($T_{MODULE}$), the RAMS temperature in the junction box ($T_{RAMS}$), and the ambient temperature ($T_{AMBIENT}$) are equal. This is due to the fact that there are no thermalization effects inside the module (due to the sunlight and resistive losses within the module) and inside the junction box (due to sunlight heating of the junction box and insertion loss of RAMS). $T_{MODULE}=T_{RAMS}=T_{AMBIENT}$ throughout the night and until dawn/sunrise and for a short period of time (e.g., approximately 30 min after module and RAMS wake-up time). Throughout the day and during the time period when the module is producing power and RAMS is ON and allowing for the power to be delivered to the load, the above-mentioned three temperatures diverge such that T MODULE and $T_{RAMS}>T_{AMBIENT}$. By measuring the module $V_{OC}$ and IMP as well as the RAMS temperature $T_{RAMS}$ shortly (i.e., within minutes) after the module and RAMS both wake up, a regular (e.g., daily) calibration may be performed for use in the measurements and algorithm used for real-time module (cells) temperature determination throughout the power-generating period from sunrise to sunset when the module and RAMS are awake and delivering power to the load. This calibration eliminates the effects of module aging on measurement accuracy.

When the PV module and RAMS circuit wake up around dawn or near sunrise (e.g., a typical module voltage built up to greater than 30 V, module producing at least 1% of its peak power, and the RAMS circuit operating and transmitting its temperature $T_{RAMS}$): 1) Measure and transmit a few (e.g., M=3 to 6 sample sets) time-stamped samples of the module open-circuit voltage and current $V_{OC(WAKEUP)}$) and $IMP_{WAKEUP}$ along with the $T_{RAMS(wakeup)}$ temperature values during the initial post-wakeup 15 to 30 minutes; 2) After the initial measurement and transmission of $V_{OC(WAKEUP)}$, $IMP_{WAKEUP}$, $T_{RAMS(wakeup)}$ data sets, measure and transmit (e.g., through a wireless network such as a wireless mesh network) the time-stamped module voltage $V_{MODULE}$ and current $I_{MODULE}$ along with the RAMS temperature $T_{RAMS}$ at known intervals (e.g., one data set every $\tau_M$=5 minutes). For every $\tau_{TEMP}$=N. $\tau_M$ time interval (with N being an integer between 1 to 10, advantageously between 1 and 6 such as N=6), RAMS performs a short-time (e.g., $t_{S\&H}$ approximately 0.1 to 1 ms) open-circuit voltage ($V_{OC}$) sampling (sample and hold), short time to minimize power disruption generation by the module and delivery from the module to the load, and transmits the time-stamped data set of $V_{OC}$, $I_{MODULE}$ (module current right before or after the $V_{OC}$ sampling), and RAMS temperature $T_{RAMS}$. For instance, for $\tau_M$=5 minutes and N=6, $\tau_{TEMP}$=N. $\tau_M$=30 minutes, resulting in one updated data set comprising $V_{OC}$ along with associated $I_{MODULE}$ and $T_{RAMS}$ every 30 minutes, thus providing an updated real-time module temperate measurement update every 30 minutes along with the module voltage, current, and $T_{RAMS}$ measurements every 5 minutes; 3) The data sets are transmitted to a PV array control and status monitoring system (PACS) or monitoring gateway and then may be transmitted to cloud servers, the module temperature (or effective mean temperature of cells) is extracted in real-time (once every $\tau_{TEMP}$=N. $\tau_{TM}$ minutes) by using the above-mentioned measured and transmitted data sets using either an analytical formula or look-up tables.

Figure 17:
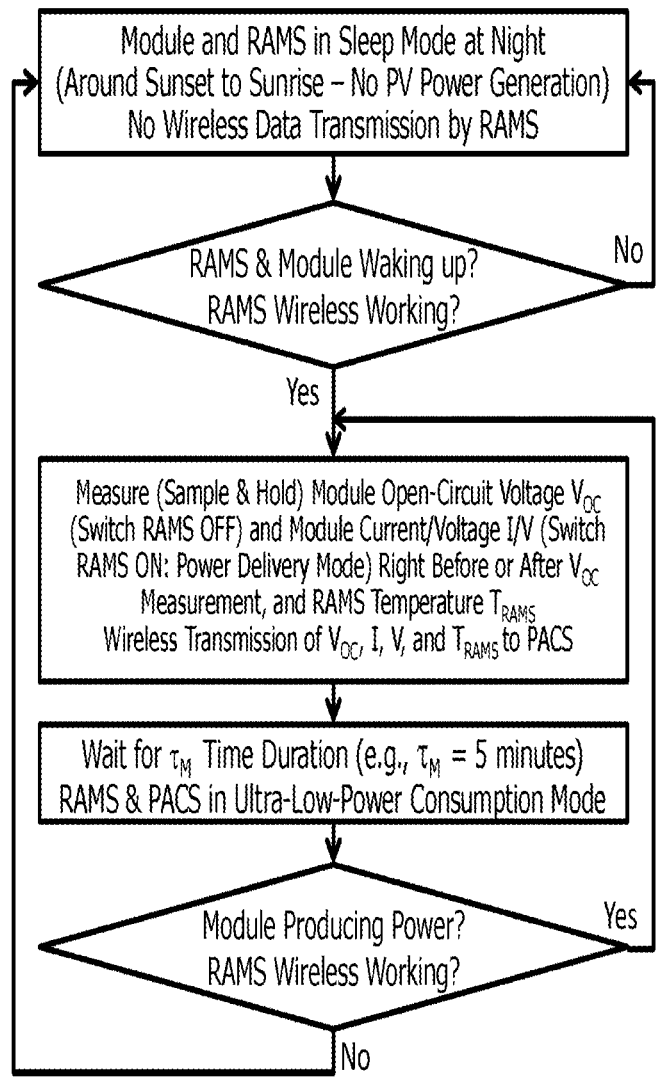
FIG. 17 shows an exemplary process flow chart and algorithm for the real-time measurement and transmission of a PV module (solar cells) temperature; and, FIG. 18 is a graph showing linear dependency of module open-circuit voltage $V_{OC}$ on temperature (of cells) for various exemplary module currents.

FIG. 17 shows an exemplary process flow chart and algorithm of a representative example for the real-time measurement and transmission of a PV module (solar cells) temperature for N=1 and using wireless data transmission.

Figure 18:
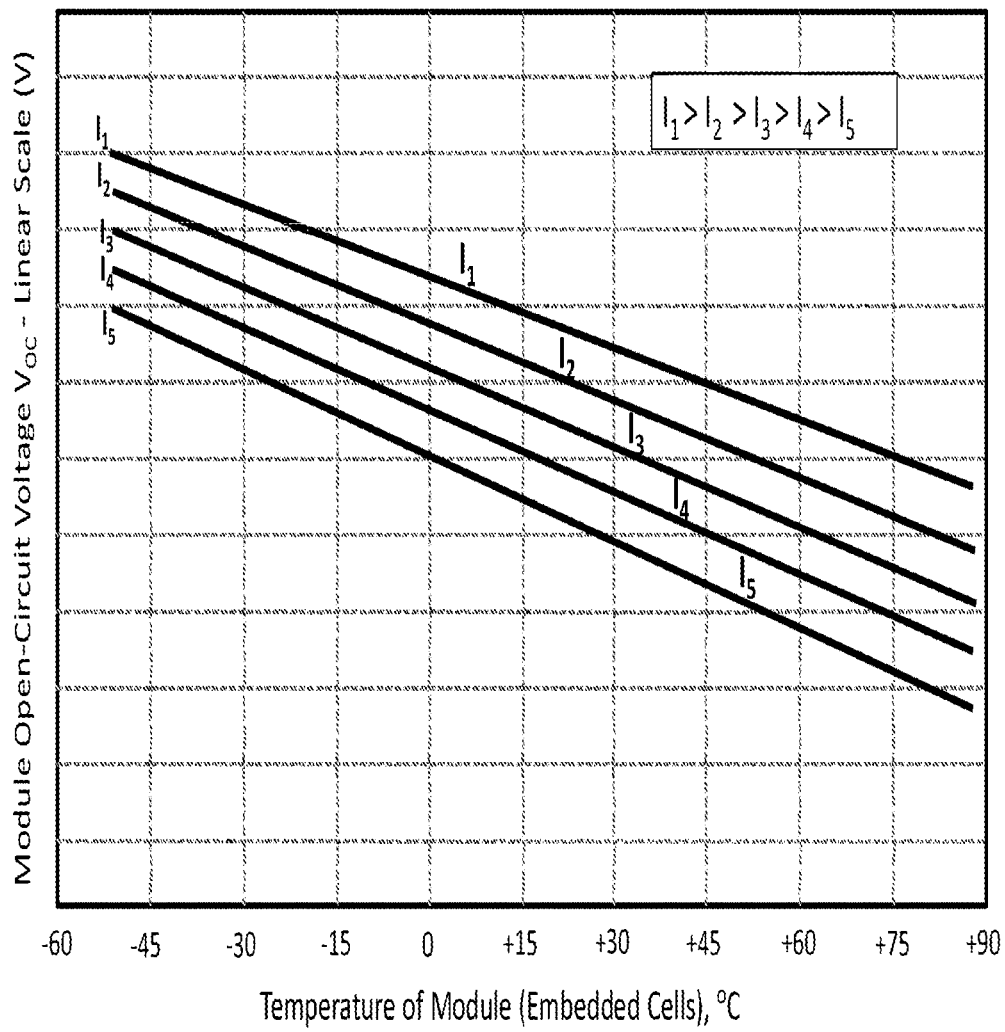

FIG. 18 is a graph showing a representative example of the relatively linear dependency of module open-circuit voltage $V_{OC}$ on temperature (of solar cells) for various exemplary module currents when the module is under load. The slopes of the linear plots are the constant temperature coefficients of $V_{OC}$ for various module currents. Note $I_1>I_2>I_3>I_4>I_5$, meaning that the higher module current (when the module is under load, i.e., delivering electrical power to a load) results in a higher open-circuit voltage when the module is placed in the open-circuit condition (i.e., detached from the load by opening a series switch). The module current increases nearly linearly with the sunlight intensity incident on the module. Therefore, the higher current values represent higher sunlight irradiance values in this graph. The slope of each linear line (i.e., α) in this plot is the temperature coefficient of $V_{OC}$ which is a relatively small negative number and is expressed in mV/° C. (or mV/K) unit. The value of a depends on the photovoltaic module technology (e.g., different values for various crystalline silicon and thin-film solar cell technologies) and is also slightly dependent on the photogenerated module current (or on the incident light intensity arriving at the module).

Thus, using the linear dependency of module open-circuit voltage $V_{OC}$ on temperature (of cells) for various exemplary module currents: define $\Delta T=T_{MODULE}-T_{RAMS(WAKEUP)}$ and $\Delta V_{OC}=V_{OC}-V_{OC(WAKEUP)}$; $\Delta T=0$ at wakeup time every day and $\Delta T \neq 0$ (typically $\Delta T>0$) throughout the day when the PV module is producing and delivering PV power to the load; $\Delta V_{OC}=0$ at wakeup time every day and $\Delta V_{OC} \neq 0$ (typically $\Delta V_{OC}=0$) throughout the day when the PV module is producing and delivering PV power to the load; a is defined as slope of $V_{OC}$ vs temperature plot for a given module PV current, and is known as the temperature coefficient of $V_{OC}$ which is a negative number and is expressed in mV/° C., α depends on the photogenerated module current; α is a characteristic of the foundation technology (for instance, a characteristic of an interdigitated back-contact monocrystalline silicon solar cell technology); on the cloud server, a look up table is set up for a vs module current values (based on the pre-characterization of the foundation technology); $\Delta V_{OC}=\alpha \cdot \Delta T$ then $V_{OC}-V_{OC(WAKEUP)}=\alpha \cdot (T_{MODULE}-T_{RAMS(WAKEUP)})$; at any time during the day when the PV module is producing and delivering power: $V_{OC(WAKEUP)}+\alpha \cdot (T_{MODULE}-T_{RAMS(WAKEUP)})$;) wherein $\alpha$ is a function of the module PV current I (or a function of the module maximum-power current $I_{MP}$); from above equation: $T_{MODULE}=T_{RAMS(WAKEUP)}+[V_{OC}-V_{OC(WAKEUP)}]/\alpha$. Cloud software (or the PACS/Gateway firmware) may use the measured data sets along with the look-up table for the $\alpha$ vs module current values to determine the actual module (cell) temperature values $T_{MODULE}$ in real time.

According to the embodiment directly above, real-time measurements of the module voltage, the module open-circuit voltage, and the module current, as well as measurements of the wake-up ambient temperature are used to calculate and provide real-time effective temperature of the solar photovoltaic module during the power generation period based on a representative example of a first module temperature extraction algorithm. The first module temperature extraction algorithm may use a formula to calculate the real-time effective temperature of the solar photovoltaic module at any operating time, as follows: (i) subtract the module open-circuit voltage at the daily wake-up time from the module open-circuit voltage at the operating time, (ii) divide the resulting voltage value by a pre-specified temperature coefficient constant of the solar photovoltaic module, and (iii) add the resulting temperature value to the wake-up ambient temperature to provide the real-time effective temperature of the solar photovoltaic module at the operating time during the power generation period. The real-time effective temperature of the solar photovoltaic module may then be communicated to a remote receiver.

Additionally, an alternative embodiment using analytical formula dependence of module $V_{OC}$ on solar irradiance (or module current) and module temperature includes the following. Short-circuit current: $I_{SC}=I_{SC(WAKEUP)}(G/G_{WAKEUP})^\sigma$ wherein G and $G_{WAKEUP}$ are the module solar irradiance values (W/m²) at any time during PV power generation and at a pre-specified wakeup time, respectively. $I_{SC}=I_{SC(WAKEUP)}$ are the module short-circuit current values at any time during PV power generation and at a pre-specified wakeup time, respectively. In this formula, the exponent $\sigma$ is a constant number close to 1 (in ideal PV modules $\sigma=1$). Similarly for maximum-power module current: $I_{MP)WAKEUP)} (G/G_{WAKEUP})^\sigma$, therefore: $((G/G_{WAKEUP})^\sigma)=(G/G_{WAKEUP})=(I_{MP}/I_{MP(WAKEUP)})^{1/\sigma}$. Module open-circuit voltage $V_{OC}$ during the daily PV module power generation period may be expresses as follows: $V_{OC}=\{V_{OC(WAKEUP)}/[1+\beta \cdot 1N(G_{WAKEUP}/G)]\} \cdot [T_{RAMS(WAKEUP)}/T_{MODULE}]^\gamma$ wherein $\beta$ is a technology-specific dimensionless constant and $\gamma$ is a fixed exponent taking into account the non-linear voltage-temperature effects; by substituting for $G_{WAKEUP}/G:=\{V_{OC(WAKEUP)}/[1+(\beta/\sigma) \cdot 1n(I_{MP(WAKEUP)}/I_{MP})]\} \cdot [T_{RAMS(WAKEUP)}/T_{MODULE}]^\gamma$; and $[T_{RAMS(WAKEUP)}/T_{MODULE}]^\gamma=(V_{OC}/V_{OC(WAKEUP)} \cdot [1+(\beta/\sigma) \cdot 1n(I_{MP(WAKEUP)}/I_{MP})]$; and $T_{RAMS(WAKEUP)}/T_{MODULE}]=\{(V_{OC}/V_{OC(WAKEUP)} \cdot [1+(\beta/\sigma) \cdot 1n(I_{MP(WAKEUP)}/I_{MP})]\}^{1/\gamma}$; assume B=$\beta/\sigma$ and A=$1/\gamma$ (both A and B are technology-dependent measured constants) then $T_{MODULE}=T_{RAMS(WAKEUP)}/\{(V_{OC}/V_{OC(WAKEUP)} \cdot [1+B \cdot 1n(I_{MP(WAKEUP)}/I_{MP})]\}^A$. This formula provides an analytical method to determine the module (cells) temperature during the PV module power generation periods based on the measured parameters.

According to the embodiment directly above, real-time measurements of the module voltage, the module open-circuit voltage, and the module current, as well as measurements of the wake-up ambient temperature are used to calculate and provide real-time effective temperature of the solar photovoltaic module during the power generation period based on a representative example of a second module temperature extraction algorithm. The second module temperature extraction algorithm uses a formula to calculate the real-time effective temperature of the solar photovoltaic module at any operating time, as follows: (i) calculate the natural logarithm of the resulting ratio of the module current at the daily wake-up time to the module current at the operating time, (ii) multiply the resulting number from the prior step by a pre-determined fixed multiplier constant, (iii) add I to the resulting number from the prior step, (iv) multiply the resulting number from the prior step by the ratio of the module open-circuit voltage at the operating time to the module open-circuit voltage at the daily wake-up time, (v) raise the resulting number from the prior step to the power of a pre-determined exponent constant, (vi) divide the wake-up ambient temperature by the resulting number from the prior step to provide the real-time effective temperature of the solar photovoltaic module at the operating time during the power generation period. The real-time effective temperature of the solar photovoltaic module may then be communicated to a remote receiver.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for calculating a real-time effective temperature of a solar photovoltaic module at any operating time during power generation period between a daily wake-up time and sleep time of said solar photovoltaic module, based on a formula as follows:
    a. Measuring a solar photovoltaic module open-circuit voltage at said daily wake-up time
    b. Measuring the solar photovoltaic module open-circuit voltage at said operating time
    c. Measuring an ambient temperature at said daily wake-up time by measuring a temperature of an electronic circuit performing real-time electrical measurements at said daily wake-up time, said electronic circuit co-located with said solar photovoltaic module during power generation operation
    d. Subtracting said solar photovoltaic module open-circuit voltage at said daily wake-up time from said solar photovoltaic module open-circuit voltage at said operating time
    e. Dividing the resulting voltage value from the prior step by a pre-specified temperature coefficient constant of said solar photovoltaic module, and
    f. Adding the resulting temperature value from the prior step to said ambient temperature at said daily wake-up time to provide said real-time effective temperature of said solar photovoltaic module at said operating time during said power generation period.

2. The method of claim 1, further comprising communicating said real-time effective temperature of said solar photovoltaic module at said operating time during said power generation period to a remote receiver.

3. The method of claim 2, wherein said communication of said real-time effective temperature of said solar photovoltaic module at said operating time during said power generation period to a remote receiver is communicated using wireless communication.

4. The method of claim 2, wherein said communication of said real-time effective temperature of said solar photovoltaic module at said operating time during said power generation period to a remote receiver is communicated using wired communication.

* * * * *